United States Patent
Noro

(10) Patent No.: US 6,734,067 B2
(45) Date of Patent: May 11, 2004

(54) METHOD OF FORMING A SEMICONDUCTOR STORAGE DEVICE

(75) Inventor: Fumihiko Noro, Kyotanabe (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/166,683

(22) Filed: Jun. 12, 2002

(65) Prior Publication Data

US 2002/0155664 A1 Oct. 24, 2002

Related U.S. Application Data

(62) Division of application No. 09/448,438, filed on Nov. 24, 1999, now abandoned.

(30) Foreign Application Priority Data

Dec. 9, 1998 (JP) .............................. 10-349729

(51) Int. Cl.[7] ...................... H01L 21/336; H01L 21/44
(52) U.S. Cl. ...................... 438/266; 438/637; 438/675
(58) Field of Search ...................... 257/320, 382–385, 257/750–776; 438/257–267, 618–651, 674–677

(56) References Cited

U.S. PATENT DOCUMENTS

| | | | | |
|---|---|---|---|---|
| 4,916,509 A | * | 4/1990 | Blanchard et al. | 257/621 |
| 5,036,378 A | * | 7/1991 | Lu et al. | 257/317 |
| 5,733,806 A | * | 3/1998 | Grivna et al. | 438/183 |
| 5,792,593 A | * | 8/1998 | McClure et al. | 430/314 |
| 6,239,009 B1 | * | 5/2001 | Choi et al. | 438/588 |

FOREIGN PATENT DOCUMENTS

| | | |
|---|---|---|
| JP | 04-005855 | 1/1992 |
| JP | 10-050829 | 2/1998 |
| JP | 10-242275 | 9/1998 |

OTHER PUBLICATIONS

Yamada et al., "Spread Source/Drain (SSD) MOSFET Using Selective Silicon Growth for 64Mbit DERAMs", 1989, IEDM Technical Digest, pp. 35–38.

* cited by examiner

*Primary Examiner*—Long Pham
*Assistant Examiner*—Marcos D. Pizarro-Crespo
(74) *Attorney, Agent, or Firm*—Nixon Peabody LLP; Donald R. Studebaker

(57) ABSTRACT

The invention provides a floating gate semiconductor storage device equipped with an erase gate electrode that includes first and second diffusion layers, an isolation insulating film, a gate insulating film, a floating gate electrode, a control gate electrode, a capacitor dielectric film, an erase gate electrode and a tunneling insulating film. In manufacturing the semiconductor storage device, after forming the first and second diffusion layers in a semiconductor substrate, an insulating film for isolation is deposited on the semiconductor substrate. The insulating film for isolation is simultaneously or individually patterned into an isolation insulating film and first and second lower contact holes respectively reaching the first and second diffusion layers. The semiconductor device includes first and second contact members filled in the first and second lower contact holes to be in contact with the first and second diffusion layers. Therefore, in first and second upper contact holes formed in an interlayer insulating film disposed above the contact members so as to respectively reach the first and second contact members, the aspect ratio can be reduced.

13 Claims, 20 Drawing Sheets

METHOD OF FORMING A SEMICONDUCTOR STORAGE DEVICE

This application is a divisional of prior application Ser. No. 09/448,438 filed on Nov. 24, 1999, now abandoned.

BACKGROUND OF THE INVENTION

The present invention relates to a semiconductor storage device comprising a floating gate EEPROM (electrically erasable and programmable read-only memory) and a method of manufacturing the same.

An EPROM (erasable and programmable read-only memory) having a floating gate structure has been conventionally well known as a nonvolatile memory. In this EPROM, a floating gate electrode is disposed on a channel region sandwiched between a source region and a drain region formed in a semiconductor substrate with a gate insulating film sandwiched between the floating gate electrode and the channel region, and a control gate electrode is disposed on the floating gate electrode with an interlayer insulating film sandwiched therebetween. In a data write operation of this EPROM, hot electrons are generated in the channel region in the vicinity of the drain region in the semiconductor substrate by allowing a current to flow through the channel region under application of a high voltage between the drain region and the control gate electrode, so that a data can be written by acceleratingly injecting the hot electrons into the floating gate electrode.

On the other hand, a data erase operation of the EPROM is conventionally conducted through UV irradiation, but recently, a data erase operation by utilizing a phenomenon that electrons can tunnel through the gate insulating film formed in a small thickness has been proposed. In this data erase operation, a data is electrically erased by releasing electrons from the floating gate electrode to the source region, the drain region or the channel region, namely, toward the semiconductor substrate, by utilizing the phenomenon.

Moreover, a memory cell structure in which a data is electrically erased by using an independently formed erase electrode instead of releasing electrons toward the semiconductor substrate has recently been proposed (for example, in Japanese Laid-Open Patent Publication No. 4-340767). In this memory cell structure using the erase gate electrode, a tunneling insulating film is disposed between the erase gate electrode and the floating gate electrode, so that a data can be erased by allowing electrons to tunnel from the floating gate electrode to the erase gate electrode under application of an erase voltage to the erase gate electrode.

On the other hand, there are recently increasing demands for improvement in refinement, integration and performance of semiconductor devices, and hence, further refinement and higher performance are also earnestly required of the above-described electrically erasable floating gate EEPROM.

Now, an example of the conventional floating gate semiconductor storage device equipped with an erase gate electrode will be described with reference to FIGS. 19 and 20(a) through 20(c). FIG. 19 is a plan view for showing the structure of a memory part of the conventional semiconductor storage device, and FIGS. 20(a) through 20(c) are sectional views thereof taken on lines XXa—XXa, XXb—XXb and XXc—XXc of FIG. 19.

As is shown in FIGS. 19 and 20(a) through 20(c), the conventional semiconductor storage device includes first and second diffusion layers 102a and 102b serving as source/drain regions formed by introducing an impurity into a Si substrate 101; an isolation insulating film 103 of a silicon oxide film deposited on the Si substrate 101; a gate insulating film 104 of a silicon oxide film; a floating gate electrode 105 of a polysilicon film; a control gate electrode 106 of a polysilicon film; a capacitor dielectric film 107 of a silicon oxide film disposed between the floating gate electrode 105 and the control gate electrode 106; a tunneling insulating film 111 of a thin silicon oxide film formed on the side face of the floating gate electrode 105; an erase gate electrode 109 of a 152 polysilicon film opposing the side face of the floating gate electrode 105 with the tunneling insulating film 111 sandwiched therebetween; a gate upper insulating film 112 of a silicon oxide film formed on the control gate electrode 106; an insulator sidewall 113 formed on the side faces of the capacitor dielectric film 107, the control gate electrode 106 and the gate upper insulating film 112; an interlayer insulating film 114 of a silicon oxide film deposited in a large thickness; first and second contact holes 115a and 115b formed in the interlayer insulating film 114 so as to respectively reach the first and second diffusion layers 102a and 102b; and a metal interconnect layer 116 formed so as to fill the first and second contact holes 115a and 115b and partially cover the interlayer insulating film 114.

In this structure of the conventional semiconductor storage device, however, as the design rule is further refined to a half micron or less, in a section where the first and second contact holes 115a and 115b appear as in FIG. 20(c), a distance between the first and second diffusion layers 102a and 102b serving as the source/drain regions becomes too small to easily cause a source-drain leakage. Accordingly, the lateral dimension of the first and second diffusion layers 102a and 102b shown in FIG. 20(b) is also restricted. However, in order to form the first and second contact holes 115a and 115b accurately on the first and second diffusion layers 102a and 102b, it is necessary to secure an overlap margin for lithography in consideration of variation caused in the manufacturing procedures. Therefore, in order to form the first and second contact holes 115a and 115b accurately on the first and second diffusion layers 102a and 102b having a small lateral dimension in FIG. 20(b), the diameter of the first and second contact holes 115a and 115b should be further reduced. In other words, the lateral dimension of the first and second contact holes 115a and 115b in the section shown in FIG. 20(c) should be unavoidably reduced in order to prevent the source-drain leakage.

When the diameter of the first and second contact holes 115a and 115b is further reduced, however, the aspect ratio of the first and second contact holes 115a and 115b becomes so large that various other problems can be caused because of the structure in which the floating gate electrode 105, the control gate electrode 106 and the erase gate electrode 109 are stacked. Specifically, a microloading phenomenon can be caused in dry etching for forming the first and second contact holes 115a and 115b, and connection failure derived from degradation of the coverage of a metal material can be caused in deposition of the metal material for forming the metal interconnect layer 116 within the first and second contact holes 115a and 115b.

SUMMARY OF THE INVENTION

An object of the invention is providing a floating gate semiconductor storage device that can be refined while preventing source-drain leakage by providing means for reducing an aspect ratio of a contact hole filled in a member in contact with a diffusion layer formed in a semiconductor substrate, and a method of manufacturing the same.

The semiconductor storage device of this invention comprises a semiconductor substrate; first and second diffusion layers working as source/drain regions formed by introducing an impurity into the semiconductor substrate; an isolation insulating film formed on the semiconductor substrate in an area including a part of the first diffusion layer and a part of the second diffusion layer; a gate insulating film formed on the semiconductor substrate in an area between the first and second diffusion layers; a floating gate electrode formed on the gate insulating film; a control gate electrode formed on the floating gate electrode; a capacitor dielectric film disposed between the floating gate electrode and the control gate electrode; a tunneling insulating film formed in contact with a side face of the floating gate electrode; an erase gate electrode opposing the side face of the floating gate electrode with the tunneling insulating film sandwiched therebetween; first and second contact members filled in two lower contact holes formed in the isolation insulating film to be in contact with the first and second diffusion layers; an interlayer insulating film deposited over the first and second contact members and the control gate electrode; and an interconnect layer filled in two upper contact holes formed in the interlayer insulating film to be in contact with the first and second contact members.

In this manner, the depth of the upper contact holes can be reduced correspondingly to the height of the first and second contact members filled in the lower contact holes formed in the isolation insulating film. Accordingly, when it is necessary to reduce the diameter of the upper contact holes, increase of the aspect ratio of the upper contact holes can be prevented. In particular, in a floating gate semiconductor storage device equipped with an erase gate electrode, the interlayer insulating film tends to become thicker because the level difference between the uppermost portion and the lowermost portion of the substrate underlying the interlayer insulating film is large, but even in such a case, the increase of the aspect ratio can be suppressed. As a result, the floating gate semiconductor storage device can be very refined while preventing leakage between the source/drain regions.

In the semiconductor storage device, when each of the contact members partially covers the interlayer insulating film so as to work as an extension electrode, the lateral dimension of the upper contact holes can be enlarged in accordance with increase of the upper area of the contact member, and hence, the aspect ratio of the upper contact holes can be reduced.

In the semiconductor storage device, when the isolation insulating film is made from an insulating film deposited by CVD, the increase of the aspect ratio of the contact hole can be suppressed against the further increased level difference on the substrate underlying the interlayer insulating film while realizing a floating gate semiconductor storage device suitable to refinement.

In the semiconductor storage device, when the contact members are made from the same material as any of the floating gate electrode, the control gate electrode and the erase gate electrode, manufacturing procedures can be simplified, resulting in reducing the manufacturing cost.

The contact members are preferably made from at least one of a refractory metal and polysilicon.

In the semiconductor storage device, when at least a lower portion of each of the contact members is made from a non-doped semiconductor, occurrence of leakage between the first and second diffusion layers can be suppressed.

When the semiconductor storage device further comprises an insulator sidewall sandwiched between each of the contact members and the side face of each of the lower contact holes, diffusion of an impurity from the first and second diffusion layers into the semiconductor substrate can be suppressed, resulting in more effectively suppressing the occurrence of leakage between the first and second diffusion layers.

The method of manufacturing a semiconductor storage device of this invention comprises the steps of (a) forming first and second diffusion layers working as source/drain regions in a semiconductor substrate; (b) forming an insulating film for isolation on an area including a part of the first diffusion layer and a part of the second diffusion layer after the step (a); (c) forming an isolation insulating film by patterning the insulating film for isolation; (d) forming first and second lower contact holes respectively reaching the first and second diffusion layers by patterning the insulating film for isolation after, before or simultaneously with the step (c); (e) forming a first insulating film on the semiconductor substrate in an area surrounded with the isolation insulating film after the step (c); (f) forming a first conductive film, a second insulating film, a second conductive film and a third insulating film successively on the first insulating film after the step (e); (g) forming a gate upper insulating film, a control gate electrode and a capacitor dielectric film by patterning the third insulating film, the second conductive film and the second insulating film after the step (f); (h) forming an insulator sidewall on side faces of the capacitor dielectric film, the control gate electrode and the gate upper insulating film after the step (g); (i) forming a floating gate electrode by removing the first conductive film through etching by using the insulator sidewall as a mask after the step (h); (j) forming a tunneling insulating film on a side face of the floating gate electrode after the step (i); (k) forming an erase gate electrode opposing the floating gate electrode with the tunneling insulating film sandwiched therebetween after the step (j); and (l) forming contact members filled in the lower contact holes.

By this method, the semiconductor storage device capable of exhibiting the aforementioned effect can be easily manufactured.

When the insulating film for isolation is formed by CVD in the step (b), the semiconductor storage device can attain a structure suitable to refinement.

The step (l) and the step (k) can be simultaneously ok carried out and the contact members and the erase gate electrode can be simultaneously formed by forming and patterning a third conductive film in the step (l).

Furthermore, the step (d) can be carried out before the step (e), the second conductive film and the third insulating film can be formed on the lower contact holes in the step (f), and the step (l) and the step (g) can be simultaneously carried out.

When the method of manufacturing a semiconductor storage device further comprises, before the step (f), a step of forming an insulator sidewall on side faces of the first and second lower contact holes, diffusion of an impurity from the first and second contact members into the semiconductor substrate can be suppressed.

When the step (d) is carried out before the step (c), the first and second lower contact holes can be formed on the insulating film for forming an isolation having a flat surface, and hence, each lower contact hole can be refined to a resolution limit in photolithography.

The contact members can be made from a stacked film including a refractory metal film and a semiconductor film in the step (l).

The contact members can be made from a stacked film including two or more semiconductor films having different impurity concentrations in the step (l).

In particular, when the contact members are formed in the step (l) by successively depositing a non-doped polysilicon film and an amorphous silicon film on the semiconductor substrate, implanting impurity ions into the amorphous silicon film, and patterning the polysilicon film and the amorphous silicon film, the impurity doped in the upper portions of the first and second contact members can be definitely prevented from diffusing into regions larger than the first and second diffusion layers.

DETAILED DESCRIPTION OF THE INVENTION

Embodiment 1

Figure 1:
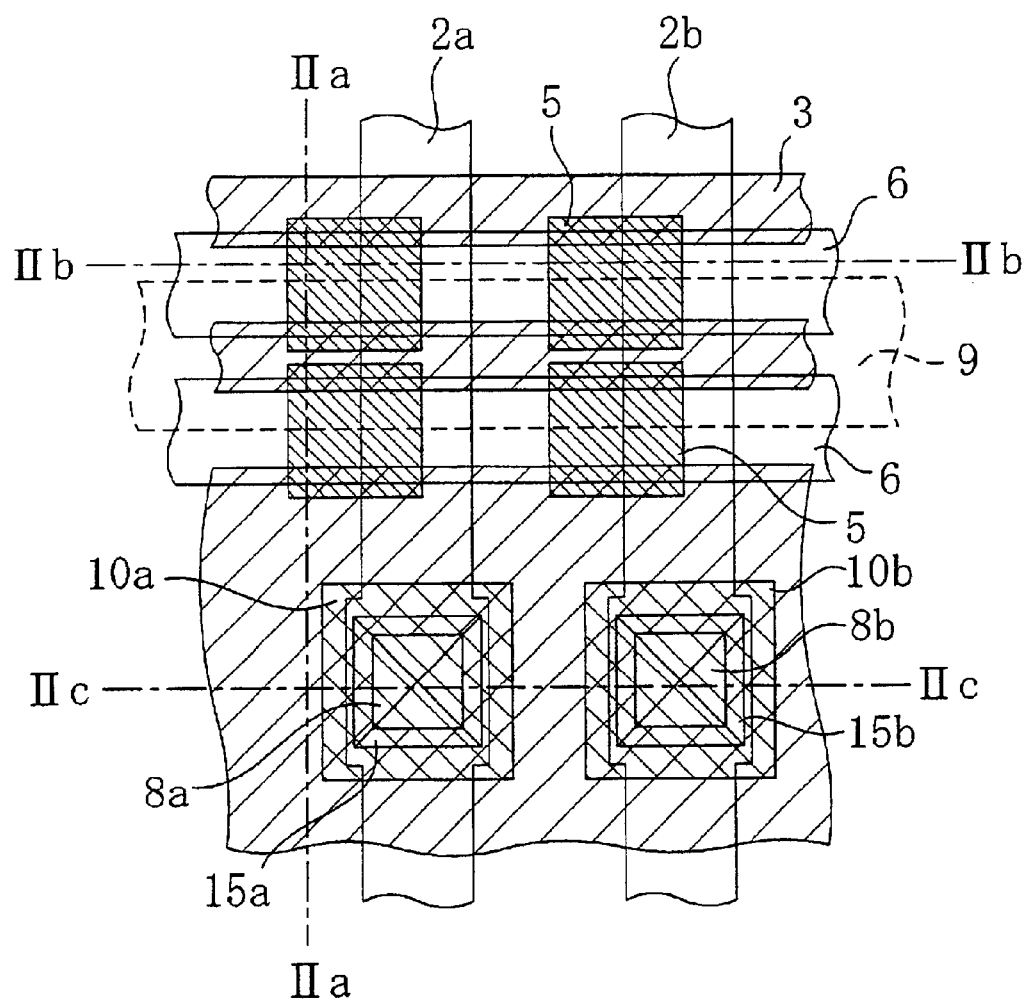
FIG. 1 is a plan view of a semiconductor storage device according to Embodiments 1 and 2 of the invention.
Figure 2A:
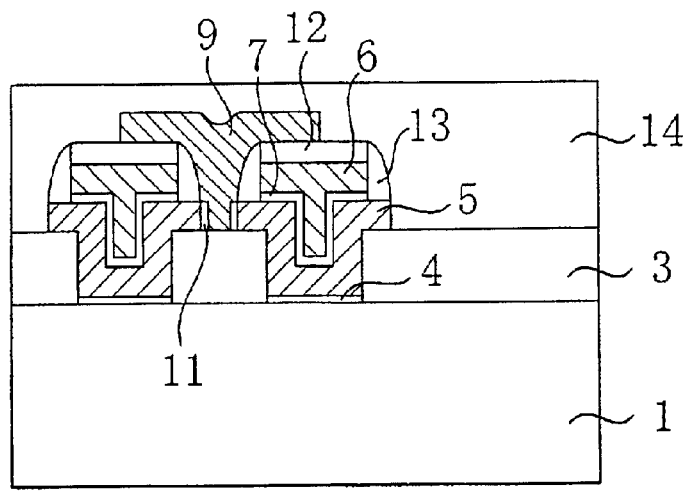
FIGS. 2(a) through 2(c) are sectional views of the semiconductor storage device of Embodiment 1 taken on lines IIa—IIa, IIb—IIb and IIc—IIc of FIG. 1.
Figure 2B:
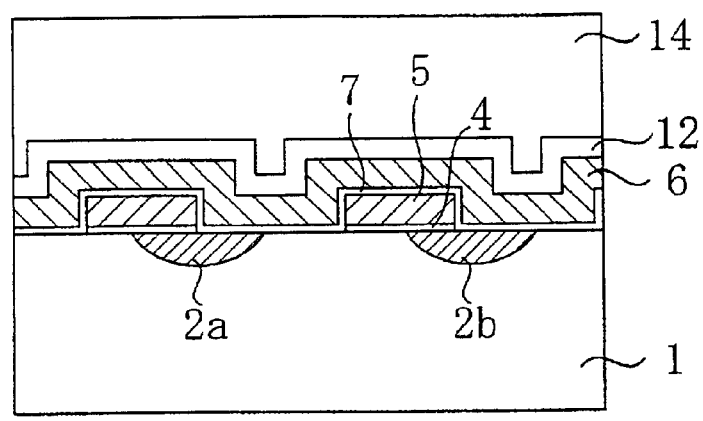
Figure 2C:
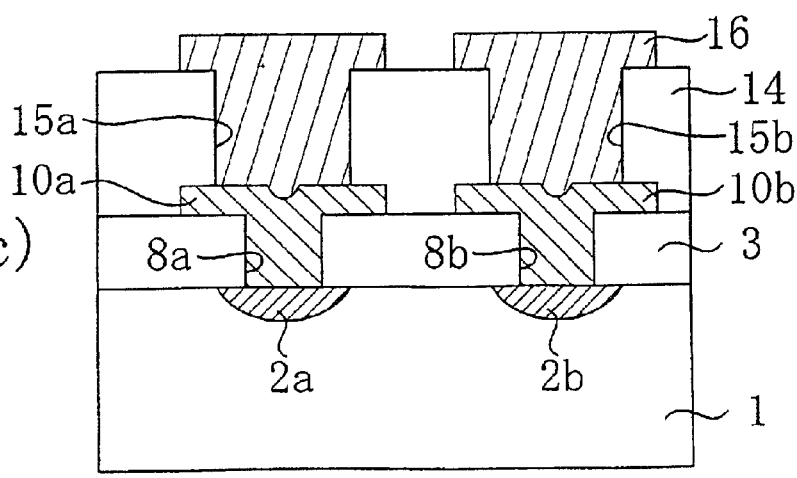

FIG. 1 is a plan view for showing the structure of a memory part of a semiconductor storage device according to Embodiment 1 of the invention, and FIGS. 2(a) through 2(c) are sectional views thereof taken on lines IIa—IIa, IIb—IIb and IIc—IIc of FIG. 1.

As is shown in FIGS. 1 and 2(a) through 2(c), the semiconductor storage device of this embodiment comprises first and second diffusion layers 2a and 2b serving as source/drain regions formed by introducing an impurity into a Si substrate 1; an isolation insulating film 3 of a silicon oxide film formed on the Si substrate 1; a gate insulating film 4 of silicon oxide; a floating gate electrode 5 of polysilicon formed on the gate insulating film 4; a control gate electrode 6 of polysilicon formed on the floating gate electrode 5; a capacitor dielectric film 7 of silicon oxide disposed between the floating gate electrode 5 and the control gate electrode 6; first and second lower contact holes 8a and 8b formed in the isolation insulating film 3 so as to respectively reach the first and second diffusion layers 2a and 2b; a thin tunneling insulating film 11 of silicon oxide formed on the side face of the floating gate electrode 5; an erase gate electrode 9 opposing the side face of the floating gate electrode 5 with the tunneling insulating film 11 sandwiched therebetween; first and second contact members 10a and 10b of polysilicon formed so as to fill the first and second lower contact holes 8a and 8b and partially cover the isolation insulating film 3; a gate upper insulating film 12 of silicon oxide formed on the control gate electrode 6; an insulator sidewall 13 formed through anisotropic etching of a silicon oxide film on the side faces of the capacitor dielectric film 7, the control gate electrode 6 and the gate upper insulating film 12; an interlayer insulating film 14 of silicon oxide deposited in a large thickness; first and second upper contact holes 15a and 15b formed in the interlayer insulating film 14 so as to respectively reach the first and second contact members 10a and 10b; and a metal interconnect layer 16 formed so as to fill the upper contact holes 15a and 15b and partially cover the interlayer insulating film 14.

Specifically, as a characteristic of the semiconductor storage device of this embodiment, the first and second contact members 10a and 10b functioning as extraction electrodes are filled in the first and second lower contact holes 8a and 8b formed in the isolation insulating film 3 and the first and second upper contact holes 15a and 15b for connecting the metal interconnect layer 16 with the first and second diffusion layers 2a and 2b are respectively in contact with the first and second contact members 10a and 10b.

In this embodiment, the first and second contact members 10a and 10b are respectively disposed between the first and second diffusion layers 2a and 2b and the metal interconnect layer 16. As a result, even when a distance between the first and second diffusion layers 2a and 2b becomes small, the depth of the first and second upper contact holes 15a and 15b for connecting the first and second diffusion layers 2a and 2b with the metal interconnect layer 16 can be reduced correspondingly to the height of the first and second contact members 10a and 10b. Furthermore, even when the lateral dimension of the upper ends of the first and second contact members 10a and 10b connected with the first and second diffusion layers 2a and 2b is increased so as to make a distance therebetween smaller than the distance between the first and second diffusion layers 2a and 2b, there is substantially no fear of a leakage current flowing between the first and second diffusion layers 2a and 2b. As a result, the first and second upper contact holes 15a and 15b respectively reaching the first and second contact members 10a and 10b can be reduced in their depth and increased in their lateral dimension. The specific dimensions of these elements will be described in detail below.

Accordingly, even when the semiconductor storage device has a very refined structure, the leakage between the first and second diffusion layers 2a and 2b serving as the source/drain regions can be prevented while avoiding increase of the aspect ratio of the first and second upper contact holes 15a and 15b. In particular, in a floating gate semiconductor storage device equipped with an erase gate electrode, the interlayer insulating film 14 tends to have a large thickness because there is a large level difference between the uppermost portion and the lowermost portion of the substrate underlying the interlayer insulating film 14. However, even when the interlayer insulating film 14 has a large thickness, the increase of the aspect ratio can be suppressed according to this embodiment. Furthermore, in the case where an oxide film formed by the CVD is used instead of an isolation insulating film formed by a LOCOS method or a trench method, the level difference on the substrate underlying the interlayer insulating film 14 is further increased. In such a case, the M effect of the invention can be remarkably exhibited while realizing a semiconductor storage device suitable to refinement using the CVD.

Although a polysilicon film is used as the contact member in this embodiment, the polysilicon film can be replaced with a refractory metal film such as a tungsten film or a tungsten polycide film.

Also, this embodiment is an example of application of this invention to a semiconductor storage device having a split gate structure in which a gate insulating film, a floating gate and the like are formed on a part of a channel region sandwiched between source/drain regions. The invention is, however, applicable to a semiconductor storage device having a stack gate structure in which a gate insulating film, a floating gate and the like are formed on an entire channel region sandwiched between source/drain regions.

Furthermore, this embodiment is an example of application of this invention to a semiconductor storage device equipped with an erase gate electrode, and it goes without saying that the invention is applicable to a semiconductor storage device not equipped with an erase gate electrode.

Now, a method of manufacturing the semiconductor storage device of this embodiment will be described with reference to FIGS. 3(a) through 3(c), 4(a) through 4(c), 5(a) through 5(c), 6(a) through 6(c), 7(a) through 7(c), 8(a) through 8(c) and 9(a) through 9(c). In these drawings, sectional views shown as (a) through (c) of each figure correspond to those taken on lines IIa—IIa, IIb—IIb and IIc—IIc of FIG. 1, respectively.

Figure 3A:
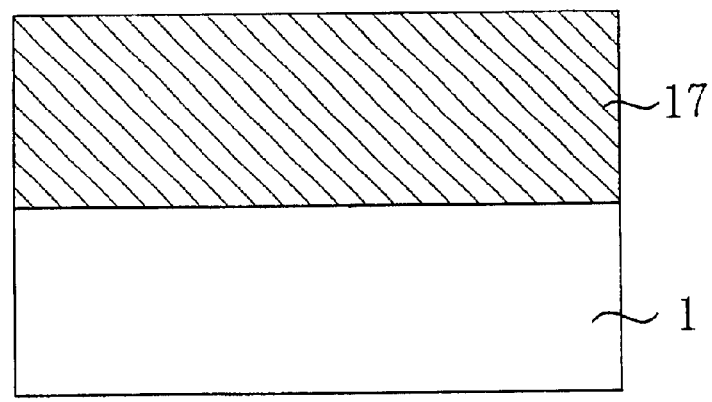
FIGS. 3(a) through 3(c) are sectional views for showing procedures up to formation of a diffusion layer in manufacture of the semiconductor storage device of Embodiment 1.
Figure 3B:
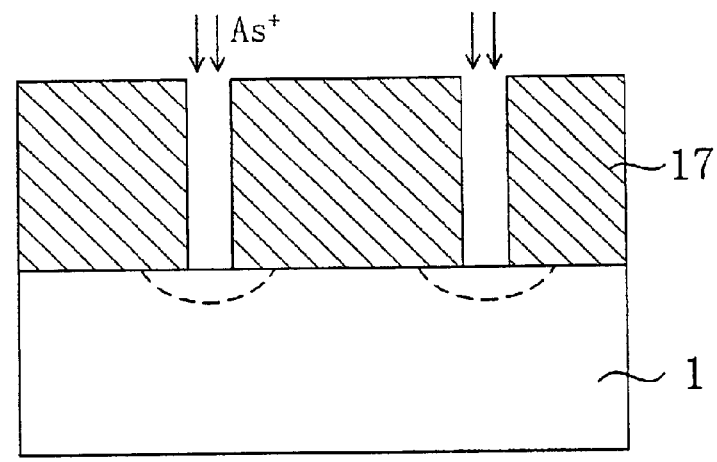
Figure 3C:
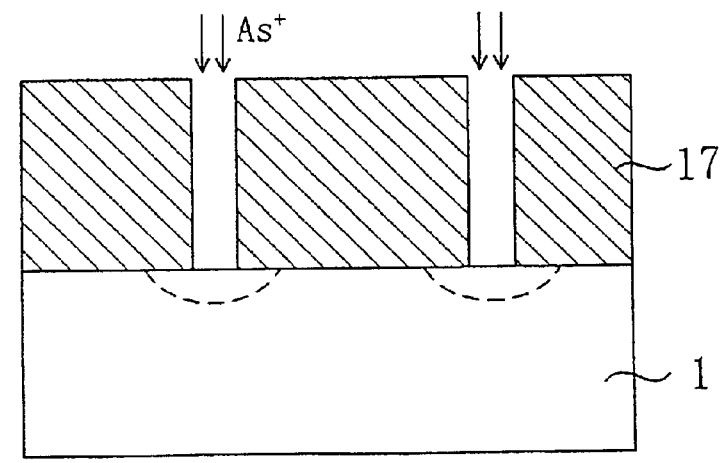

First, in procedures shown in FIGS. 3(a) through 3(c), a photoresist film 17 for forming diffusion layers is formed on a main surface of a Si substrate 1 by a known photoresist technique, and arsenic ions are implanted into the Si substrate 1 at an accelerating voltage of approximately 40 KeV and a dose of approximately $5 \times 10^{15}/cm^2$.

Figure 4A:
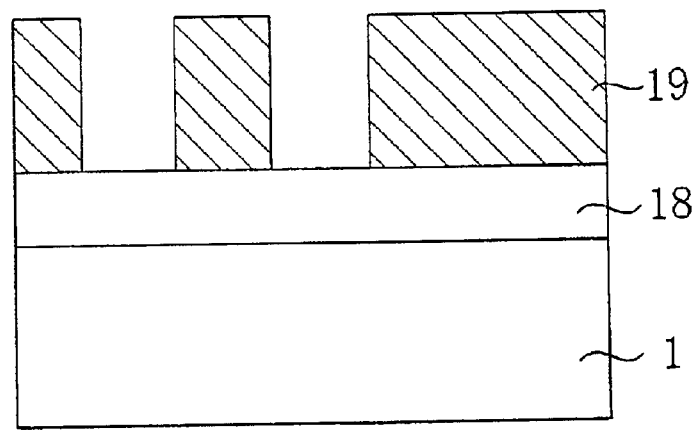
FIGS. 4(a) through 4(c) are sectional views for showing procedures up to formation of an isolation insulating film in the manufacture of the semiconductor storage device of Embodiment 1.
Figure 4B:
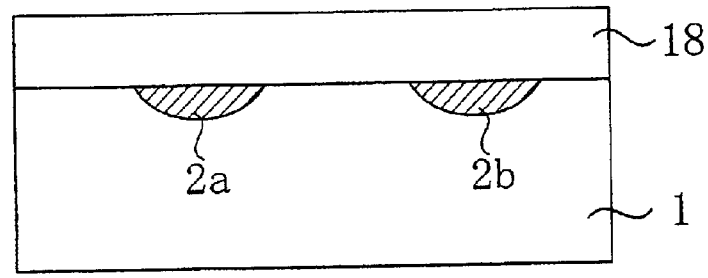
Figure 4C:
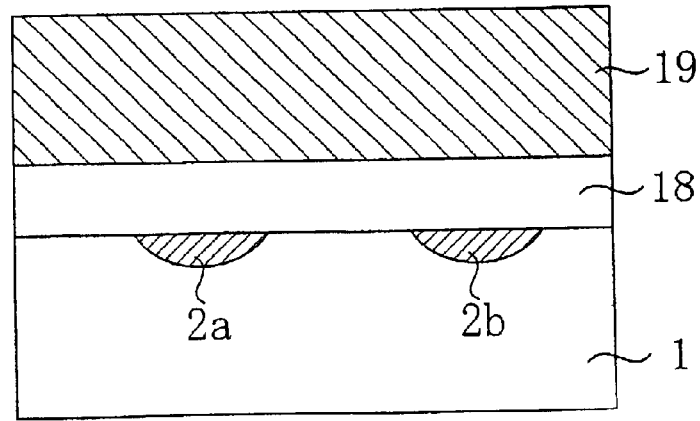

Next, in procedures shown in FIGS. 4(a) through 4(c), the photoresist mask 17 for forming the diffusion layers is removed, and the implanted impurity is diffused by conducting a heat treatment in an atmosphere of nitrogen at approximately 950° C. for approximately 30 minutes. Thus, N-type first and second diffusion layers 2a and 2b with a depth of approximately 0.4 μm are formed. Furthermore, a silicon oxide film 18 for isolation with a thickness of approximately 400 nm is deposited on the substrate, and a photoresist mask 19 for forming an isolation is formed on the silicon oxide film 18.

Figure 5A:
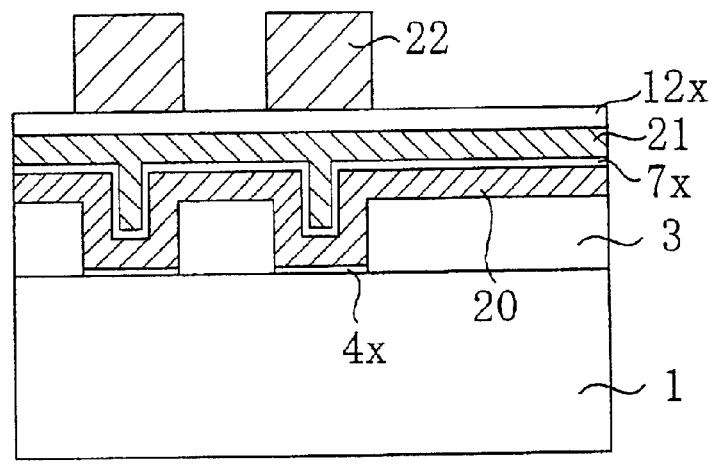
FIGS. 5(a) through 5(c) are sectional views for showing procedures up to formation of a third silicon oxide film in the manufacture of the semiconductor storage device of Embodiment 1.
Figure 5B:
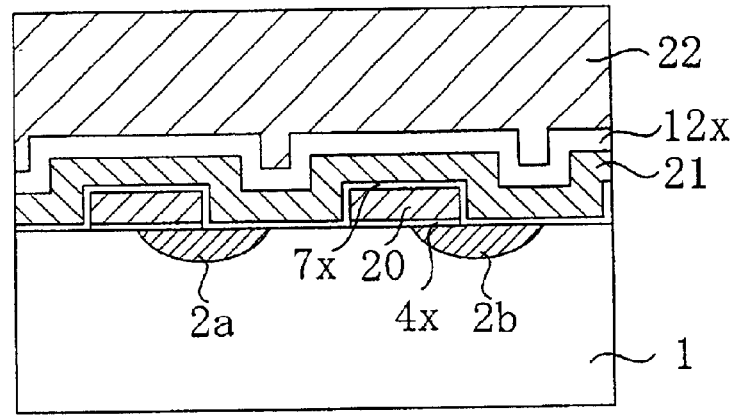
Figure 5C:
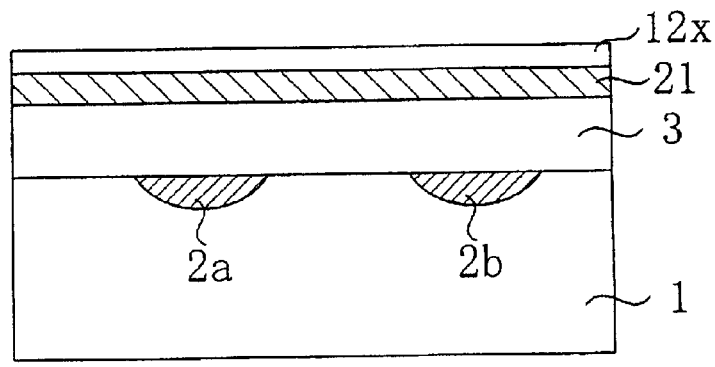

Then, in procedures shown in FIGS. 5(a) through 5(c), a predetermined portion of the silicon oxide film 18 for isolation is removed by known anisotropic dry etching, thereby forming an isolation insulating film 3. Thereafter, the photoresist mask 19 for forming an isolation is removed. Subsequently, the surface of a portion of the Si substrate 1 surrounded with the isolation insulating film 3 is oxidized by known thermal oxidation, thereby forming a first silicon oxide film 4x with a thickness of 30 nm. Furthermore, a first polysilicon film 20 with a thickness of approximately 300 nm is deposited on the first silicon oxide film 4x by known low pressure CVD.

Next, the first polysilicon film 20 and the first silicon oxide film 4x are partially removed by a known photoetching technique. Then, a second silicon oxide film 7x with a thickness of approximately 15 nm is deposited on the substrate by known low pressure CVD and a heat treatment is conducted at 900° C. so as to densify the second silicon oxide film 7x. Next, a second polysilicon film 21 with a thickness of approximately 300 nm and a third silicon oxide film 12x with a thickness of approximately 300 nm are successively formed on the substrate by known low pressure CVD, and a photoresist mask 22 for forming a control gate electrode is formed thereon by a known photolithography technique.

Figure 6A:
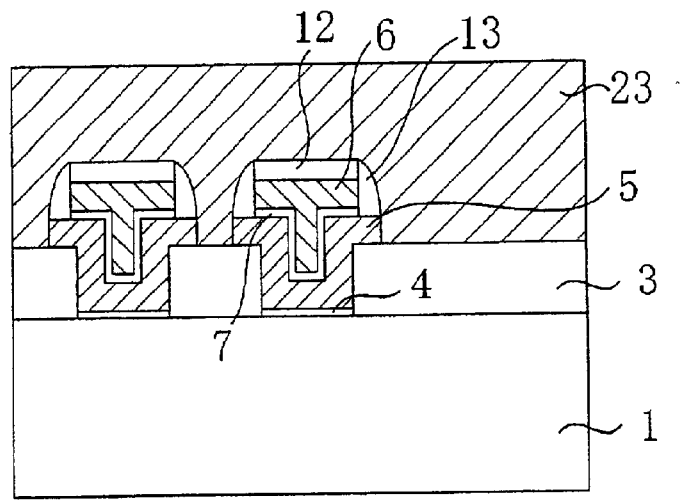
FIGS. 6(a) through 6(c) are sectional views for showing procedures up to formation of a floating gate electrode in the manufacture of the semiconductor storage device of Embodiment 1.
Figure 6B:
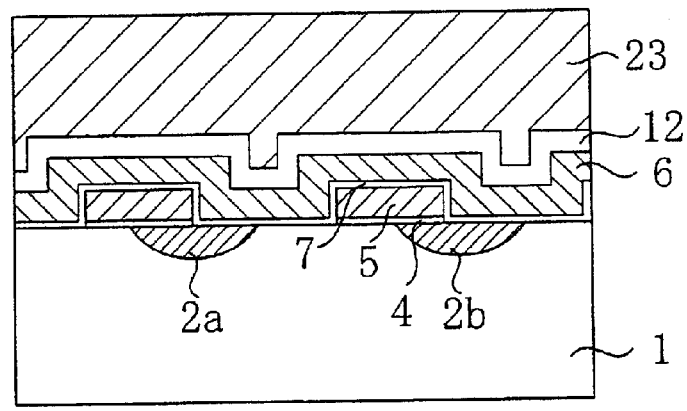
Figure 6C:
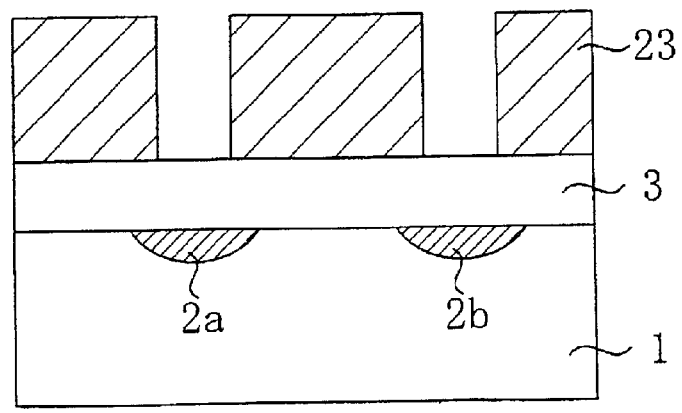

Next, in procedures shown in FIGS. 6(a) through 6(c), etching is conducted by using the photoresist mask 22, so as to pattern the third silicon oxide film 12x into a gate upper insulating film 12. Then, after removing the photoresist mask 22 for forming a control gate electrode, etching is conducted by using the gate upper insulating film 12 as a mask, so as to pattern the second polysilicon film 21 and the second silicon oxide film 7x into a control gate electrode 6 and a capacitor dielectric film 7. Subsequently, a silicon oxide film with a thickness of approximately 200 nm is deposited on the substrate by known low pressure CVD, and an insulator sidewall 13 is formed on the side faces of the control gate electrode 6, the capacitor dielectric film 7 and the gate upper insulating film 12 by known anisotropic dry etching. Next, the first polysilicon film 20 is patterned into a floating gate electrode by known anisotropic dry etching using the gate upper insulating film 12 and the insulator sidewall 13 as masks. Then, a photoresist mask 23 for forming a lower contact hole is formed on the substrate by a known photolithography technique.

Figure 7A:
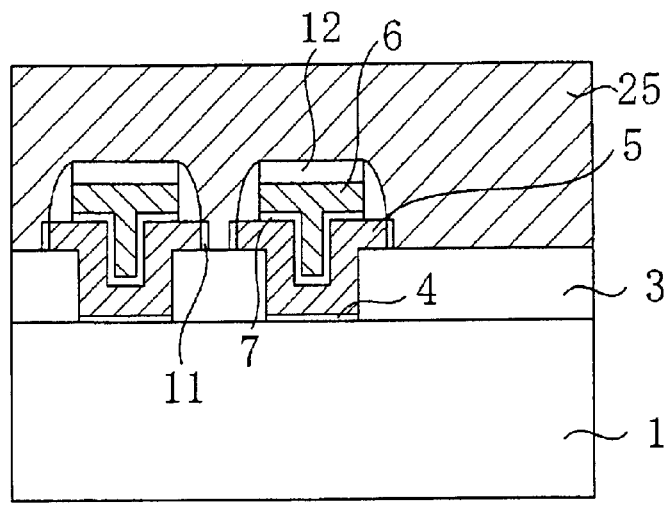
FIGS. 7(a) through 7(c) are sectional views for showing procedures up to formation of a tunneling insulating film in the manufacture of the semiconductor storage device of Embodiment 1.
Figure 7B:
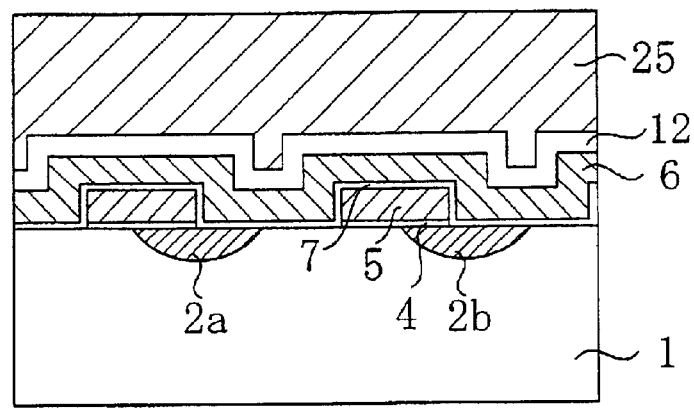
Figure 7C:
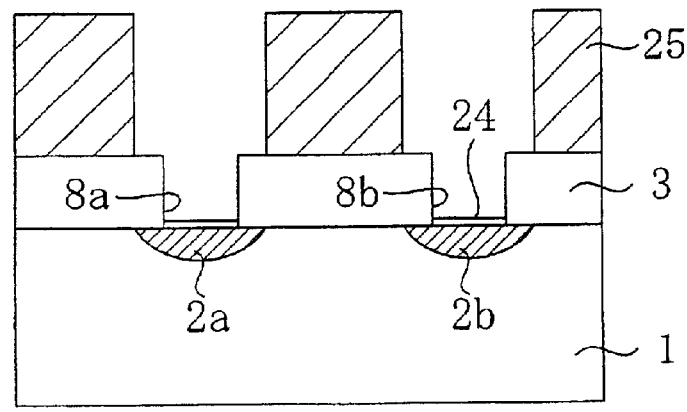

Next, in procedures shown in FIGS. 7(a) through 7(c), etching is conducted by using the photoresist mask 23 for forming a lower contact hole, so as to form first and second lower contact holes 8a and 8b respectively reaching the first and second diffusion layers 2a and 2b in the isolation insulating film 3. Thereafter, the photoresist mask 23 for forming a lower contact hole is removed. Subsequently, the exposed side face of the floating gate electrode 5 is oxidized by known thermal oxidation in, for example, an atmosphere of vapor at approximately 900° C. for 20 minutes, thereby forming a tunneling insulating film 11 of a silicon oxide film with a thickness of approximately 30 nm. At this point, in portions of the surface of the Si substrate 1 exposed in the bottoms of the first and second lower contact holes 8a and 8b, a parasitic silicon oxide film 24 is formed. Subsequently, a photoresist mask 25 for removing the parasitic silicon oxide film is formed by a known photolithography technique.

Figure 8A:
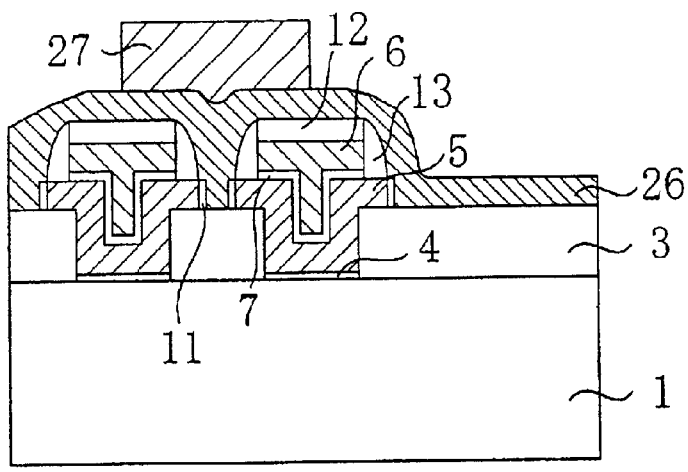
FIGS. 8(a) through 8(c) are sectional views for showing procedures up to formation of a photoresist mask for forming a control gate electrode in the manufacture of the semiconductor storage device of Embodiment 1.
Figure 8B:
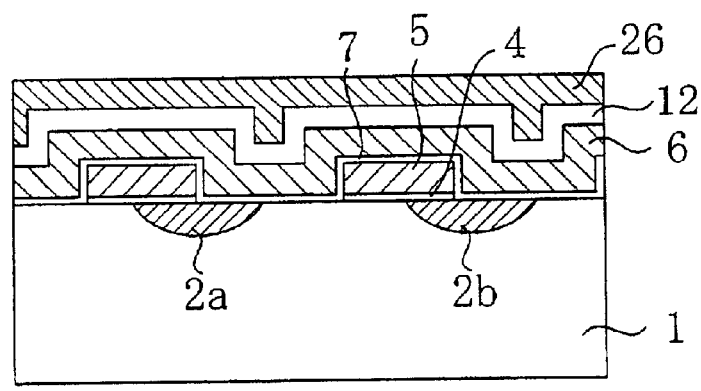
Figure 8C:
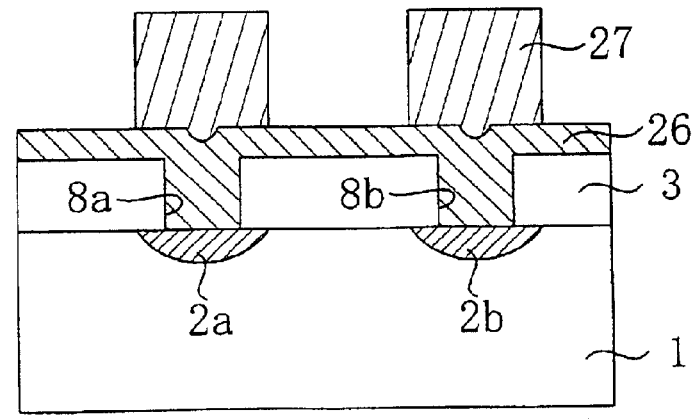

Next, in procedures shown in FIGS. 8(a) through 8(c), after removing the parasitic silicon oxide film 24 by known wet etching, for example, by using a hydrofluoric acid aqueous solution, the photoresist mask 25 for removing the parasitic silicon oxide film is removed. Then, a third polysilicon film 26 with a thickness of approximately 400 nm is deposited on the substrate by known low pressure CVD. At this point, an impurity is introduced into the third polysilicon film 26 by ion implantation conducted after deposition or by impurity doping conducted during the CVD. Thereafter, a photoresist mask 27 for patterning the third polysilicon film 26 is formed on the substrate.

Figure 9A:
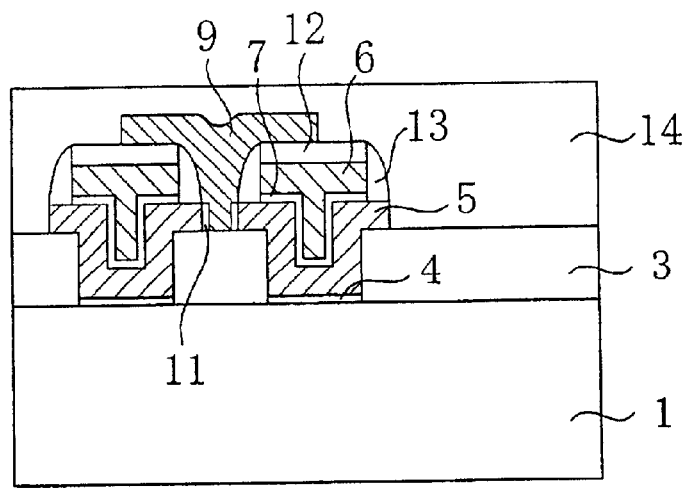
FIGS. 9(a) through 9(c) are sectional views for showing procedures up to formation of an interlayer insulating film and an interconnect layer after forming a contact member and an erase gate electrode in the manufacture of the semiconductor storage device of Embodiment 1.
Figure 9B:
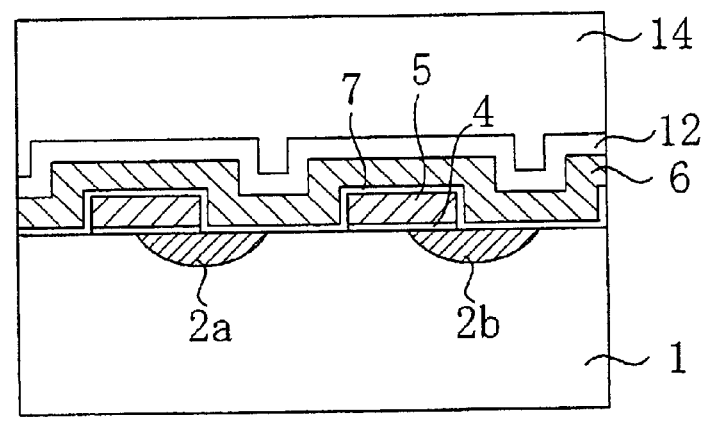
Figure 9C:
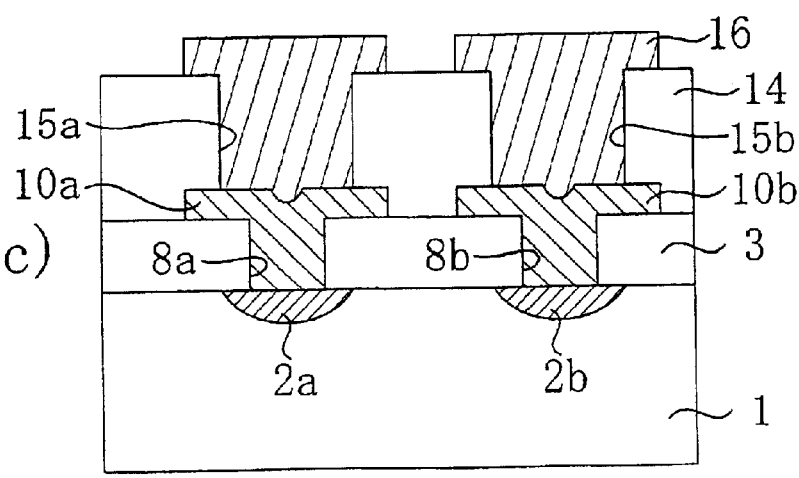

Next, in procedures shown in FIGS. 9(a) through 9(c), the third polysilicon film 26 is patterned by known anisotropic dry etching, thereby forming an erase gate electrode 9 and first and second contact members 10a and 10b filled in the first and second lower contact holes 8a and 8b. At this point, a vertical dimension from the bottom of the first or second lower contact hole 8a or 8b to the upper end of the first or second contact member 10a or 10b is approximately 800 nm, and the first and second contact members 10a and 10b have a lateral dimension in their upper end of approximately 0.5 μm. Subsequently, an interlayer insulating film 14 of a BPSG film with a thickness of approximately 1.6 μm is deposited by known low pressure CVD, and the interlayer insulating film 14 is flattened by reflow. After this reflow, the interlayer insulating film 14 has a thickness of 200 through 300 nm in a thinnest portion and of approximately 2 μm in a thickest portion. Furthermore, the interlayer insulating film 14 has a thickness of approximately 1.6 μm in a portion on the isolation insulating film 3 and a thickness of approximately 1.2 μm in a portion on the first or second contact member 10a or 10b.

Thereafter, first and second upper contact holes 15a and 15b are formed in the interlayer insulating film 14 so as to respectively reach the first and second contact members 10a and 10b. At this point, since the interlayer insulating film 14 has a thickness of approximately 1.2 μm in the portion on the first or second contact member 10a or 10b, the first and second upper contact holes 15a and 15b have a depth of approximately 1.2 μm. Furthermore, the first and second upper contact holes 15a and 15b have a diameter of approximately 0.3 μm. Thereafter, a metal interconnect layer 16 is formed so as to fill the first and second upper contact holes 15a and 15b and partially cover the interlayer insulating film 14.

Subsequent procedures for forming a protection film and a bonding pad are herein omitted in the description and drawings.

Figure 20A:
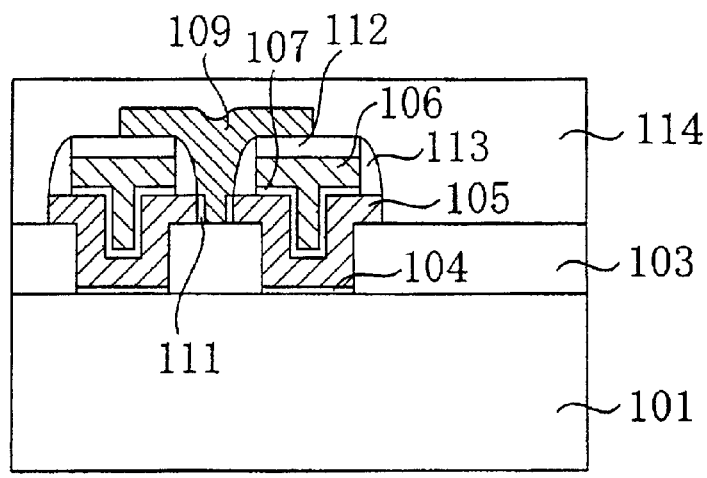
FIGS. 20(a) through 20(c) are sectional views of the conventional floating gate semiconductor storage device taken on lines XXa—XXa, XXb—XXb and XXc—XXc of FIG. 19.
Figure 20B:
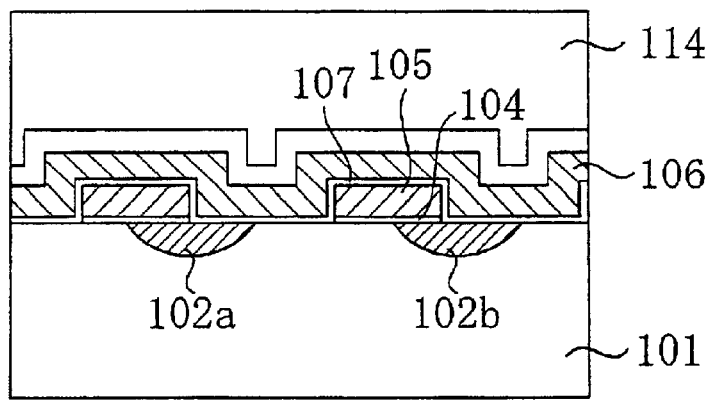
Figure 20C:
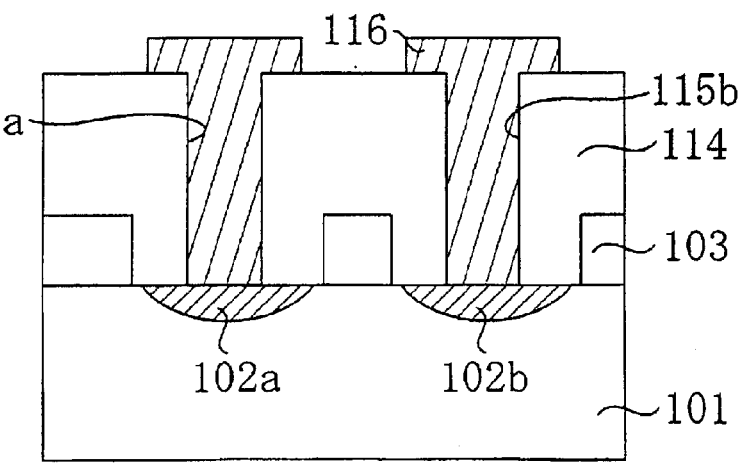

In this manner, the depth the first and second upper contact holes 15a and 15b formed by the method of this embodiment can be reduced correspondingly to the height of the first and second contact members 10a and 10b as compared with that formed by the conventional technique, and the depth is specifically approximately 1.2 μm. In contrast, in the above-described conventional semiconductor storage device, assuming that the respective elements have the same sizes as those of the semiconductor storage device of this embodiment, the depth of the first and second contact holes 115a and 115b is approximately 2 μm as is understood from the structure shown in FIG. 20(c). Furthermore, the diameter of the first and second upper contact holes 15a and 15b can be larger in this embodiment by enlarging the lateral dimension of the upper ends of the first and second contact members 10a and 10b serving as extension electrodes. Accordingly, in the semiconductor storage device of this embodiment, the aspect ratio of the first and second upper contact holes 15a and 15b can be effectively suppressed from increasing while securing the same lateral dimension thereof as that in the conventional semiconductor storage device.

In addition, in the manufacturing method of this embodiment, the erase gate electrode 9 and the first and second contact members 10a and 10b are simultaneously formed by patterning the third polysilicon film 26. Therefore, the aforementioned effect can be exhibited without increasing the number of procedures as compared with that for manufacturing the conventional semiconductor storage device.

The first and second contact members 10a and 10b are not always required to partially cover the isolation insulating film 3 but can be formed so as to merely fill the first and second lower contact holes 8a and 8b. Also in this case, the effect to suppress the increase of the aspect ratio can be exhibited owing to the reduction of the depth of the first and second upper contact holes 15a and 15b.

However, when the first and second contact members 10a and 10b partially cover the isolation insulating film 3 so as to work as the extension electrodes, the diameter of the first and second upper contact holes 15a and 15b can be enlarged. Therefore, the effect to suppress the increase of the aspect ratio can be more remarkably exhibited.

Although the first and second contact members 10a and 10b are formed from the polysilicon film the same as that used for forming the erase gate electrode 9 in this embodiment, the first and second contact members 10a and 10b can be formed from the polysilicon film the same as that used for forming the control gate electrode 6 or the floating gate electrode 5. Also in this case, it goes without saying that the same effect can be attained.

Embodiment 2

Figure 10A:
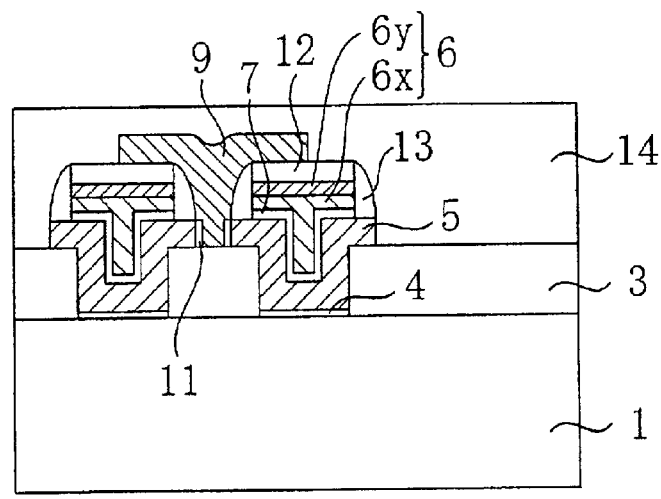
FIGS. 10(a) through 10(c) are sectional views of the semiconductor storage device of Embodiment 2 taken on lines IIa—IIa, IIb—IIb and IIc—IIc of FIG. 1.
Figure 10B:
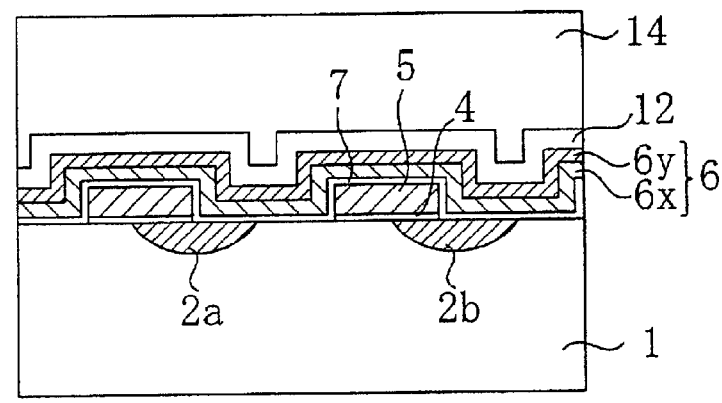
Figure 10C:
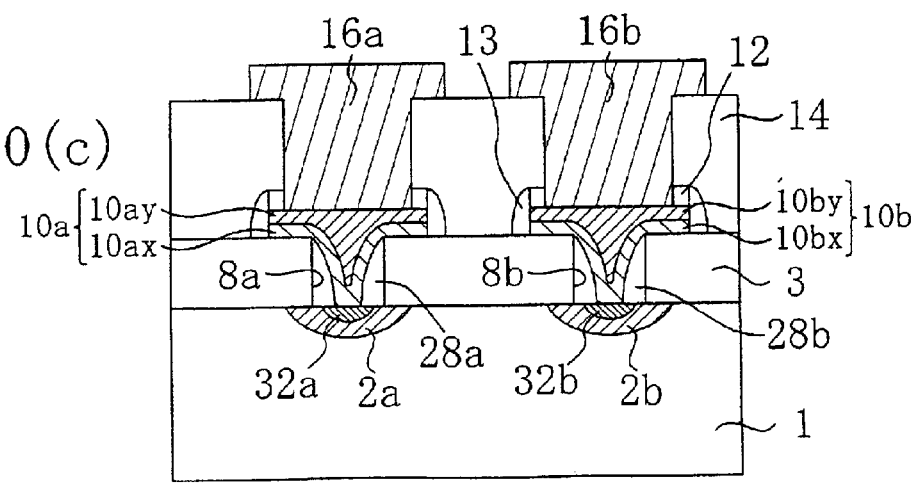

A semiconductor storage device of Embodiment 2 of the invention has a plane structure basically the same as that of Embodiment 1, and hence the description and drawing of the plane structure thereof is herein omitted. FIGS. 10(a) through 10(c) are sectional views of a memory part of the semiconductor storage device of Embodiment 2 taken on lines IIa—IIa, IIb—IIb and IIc—IIc of FIG. 1.

As is shown in FIGS. 10(a) through 10(c), the semiconductor storage device of this embodiment comprises, similarly to the semiconductor storage device of Embodiment 1, first and second diffusion layers 2a and 2b, an isolation insulating film 3, a gate insulating film 4, a floating gate electrode 5, a control gate electrode 6, a capacitor dielectric film 7, first and second lower contact holes 8a and 8b, a tunneling insulating film 11, an erase gate electrode 9, first and second contact members 10a and 10b, a gate upper insulating film 12, an insulator sidewall 13, an interlayer insulating film 14, first and second upper contact holes 15a and 15b and a metal interconnect layer 16.

In this manner, in the semiconductor storage device of this embodiment, similarly to the semiconductor storage device of Embodiment 1, the first and second contact members 10a and 10b working as extension electrodes are filled in the first and second lower contact holes 8a and 8b formed in the isolation insulating film 3, and the first and second upper contact holes 15a and 15b for connecting the metal interconnect layer 16 with the first and second diffusion layers 2a and 2b respectively reach the first and second contact members 10a and 10b.

As a characteristic of the semiconductor storage device of this embodiment in comparison with the device of Embodiment 1, insulator sidewalls 28a and 28b of silicon oxide are formed on the side faces of the first and second lower contact holes 8a and 8b, respectively, and the first and second contact members 10a and 10b filled in the first and second lower contact holes 8a and 8b respectively include lower contacts 10ax and 10bx of non-doped polysilicon and upper contacts 10ay and 10by of polysilicon doped with an impurity in a concentration of, for example, $1 \times 10^{15}/cm^3$. Furthermore, the control gate electrode 6 also includes a lower gate 6x of non-doped polysilicon and an upper gate 6y of polysilicon doped with an impurity. The lower contacts 10ax and 10bx of the first and second contact members 10a and 10b and the lower gate 6x of the control gate electrode 6 are formed from the same polysilicon film, and the upper contacts 10ay and 10by of the first and second contact members 10a and 10b and the upper gate 6y of the control gate electrode 6 are formed from the other same polysilicon film. In areas on the surface of the Si substrate 1 in contact with the first and second contact members 10a and 10b and surrounded with the first and second diffusion layers 2a and 2b, first and second contact diffusion layers 32a and 32b are formed from the impurity diffused from the upper contacts 10ay and 10by.

The semiconductor storage device of this embodiment can exhibit the following effects in addition to the effect exhibited also by the semiconductor storage device of Embodiment 1.

The first and second diffusion layers 2a and 2b are formed by implanting impurity ions. When the impurity doped in the first and second contact members 10a and 10b are diffused, through a heat treatment or the like conducted thereafter, into the Si substrate 1 in regions larger than the first and second diffusion layers 2a and 2b, a leakage can be easily caused between the source/drain regions.

In this embodiment, even when the impurity in a high concentration is diffused from the upper contacts 10ay and 10by into the Si substrate 1, the impurity can be prevented from being diffused into regions larger than the first and second diffusion layers 2a and 2b because the lower contacts 10ax and 10bx are disposed between the upper contacts 10ay and 10by and the first and second diffusion layers 2a and 2b. Therefore, the first and second contact diffusion layers 32a and 32b can be formed merely in small regions in the vicinity of the surface of the Si substrate 1. On the other hand, since the upper contacts 10ay and 10by of the first and second contact members 10a and 10b are doped with the impurity, the contact resistance between the first and second contact members 10a and 10b and the metal interconnect layer 16 can be suppressed to substantially the same as that of Embodiment 1.

Owing to the first and second contact diffusion layers 32a and 32b, the contact resistance between the first and second contact members 10a and 10b and the first and second diffusion layers 2a and 2b can be also kept to be substantially the same level as that of Embodiment 1.

Furthermore, since the insulator sidewalls 28a and 28b are provided on the side faces of the lower contact holes 8a and 8b in this embodiment, the contact area between the first and second contact members 10a and 10b and the first and second diffusion layers 2a and 2b can be small. Accordingly, spread of the first and second contact diffusion layers 32a and 32b can be further definitely suppressed.

In this embodiment, the lower contacts 10ax and 10bx of the first and second contact members 10a and 10b and the lower gate 6x of the control gate electrode 6 are formed from the same non-doped polysilicon film, and the upper contacts 10ay and 10by of the first and second contact members 10a and 10b and the upper gate 6y of the control gate electrode 6 are formed from the same doped polysilicon film. Therefore, the manufacturing procedures can be simplified. However, the first and second contact members 10a and 10b and the control gate electrode 6 can be formed from different stacked polysilicon layers.

Furthermore, the upper gate 6y and the upper contacts 10ay and 10by can be made from a refractory metal film, such as tungsten, so that the control gate electrode 6 and the first and second contact members 10a and 10b can be made from a polymetal film.

This embodiment is an example of application of the invention to a semiconductor storage device having a split gate structure in which a gate insulating film, a floating gate electrode and the like are formed in a part of a channel region sandwiched between source and drain regions. The invention is, however, applicable to a semiconductor storage device having a stack gate structure in which a gate insulating film, a floating gate electrode and the like are formed on an entire channel region sandwiched between source and drain regions.

Moreover, this embodiment is an example of application of the invention to a semiconductor storage device equipped with an erase gate electrode, and it goes without saying that the invention is applicable to a semiconductor storage device not equipped with an erase gate electrode.

Now, a method of manufacturing the semiconductor storage device of this embodiment will be described with reference to FIGS. 11(a) through 11(c), 12(a) through 12(c), 13(a) through 13(c), 14(a) through 14(c), 15(a) through 15(c), 16(a) through 16(c), 17(a) through 17(c) and 18(a) through 18(c). In these drawings, sectional views shown as (a) through (c) of each figure correspond to those taken on lines IIa—IIa, IIb—IIb and IIc—IIc of FIG. 1, respectively.

Figure 11A:
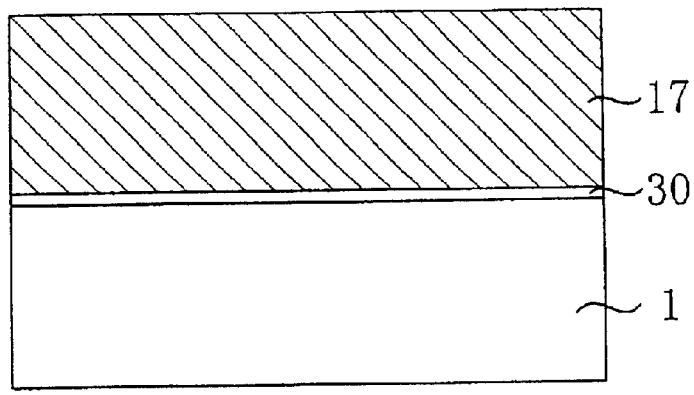
FIGS. 11(a) through 11(c) are sectional views for showing procedures up to formation of a diffusion layer in manufacture of the semiconductor storage device of Embodiment 2.
Figure 11B:
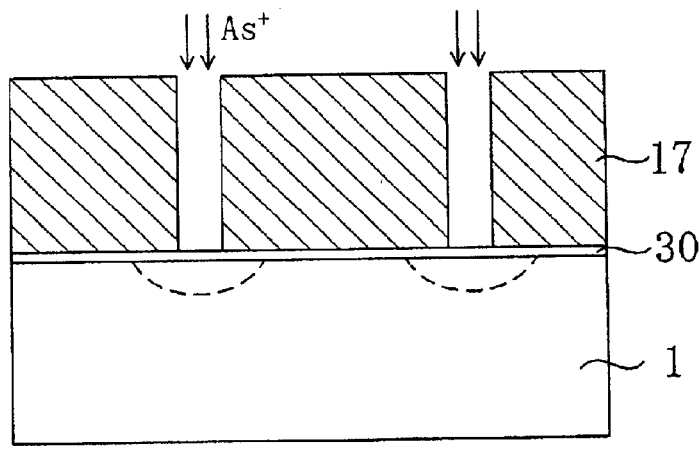
Figure 11C:
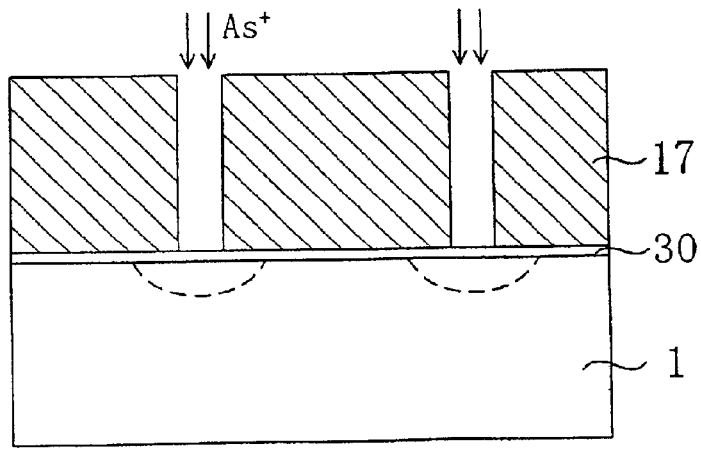

First, in procedures shown in FIGS. 11(a) through 11(c), a protection oxide film 30 is formed on a main surface of a Si substrate 1. A photoresist mask 17 for forming diffusion layers is formed on the protection oxide film 30 by a known photoresist technique, so as to implant arsenic ions into the Si substrate 1 at an accelerating voltage of approximately 40 KeV and a dose of approximately $5 \times 10^{15}/cm^2$.

Figure 12A:
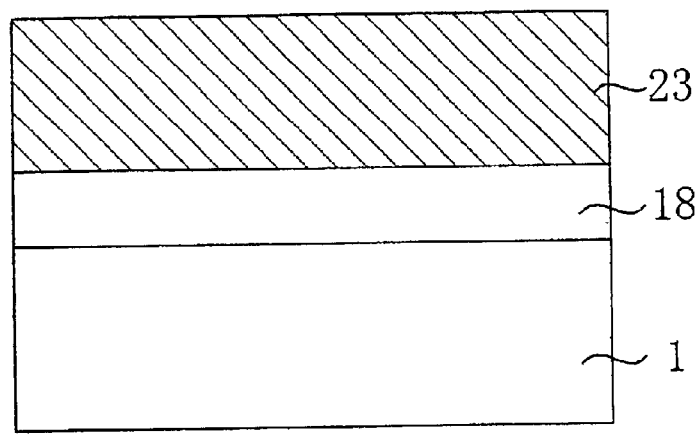
FIGS. 12(a) through 12(c) are sectional views for showing procedures up to formation of a lower contact hole in the manufacture of the semiconductor storage device of Embodiment 2.
Figure 12B:
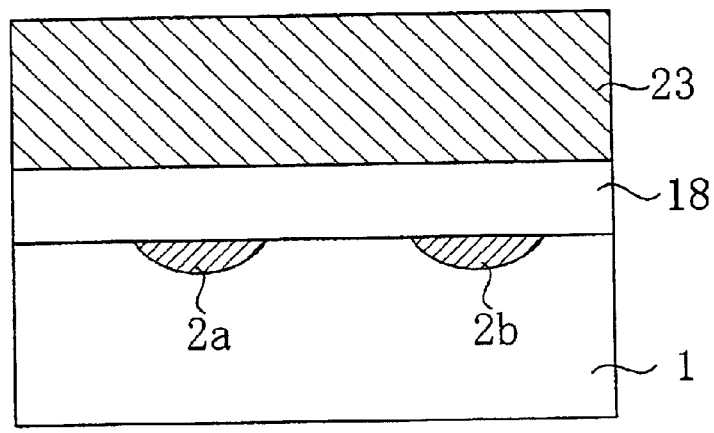
Figure 12C:
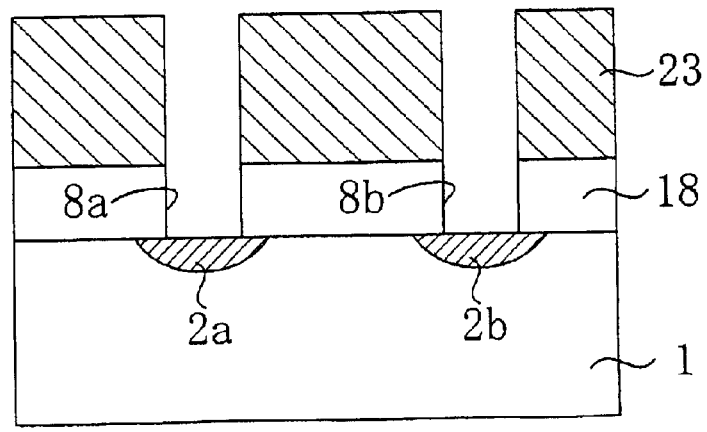
Figure 13A:
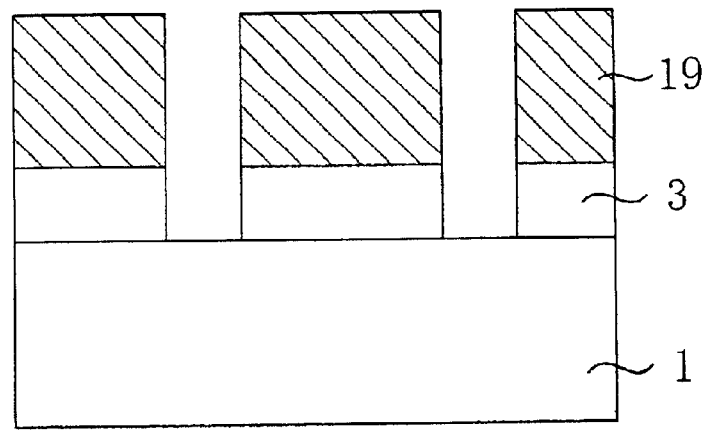
FIGS. 13(a) through 13(c) are sectional views for showing procedures up to formation of an isolation insulating film in the manufacture of the semiconductor storage device of Embodiment 2.
Figure 13B:
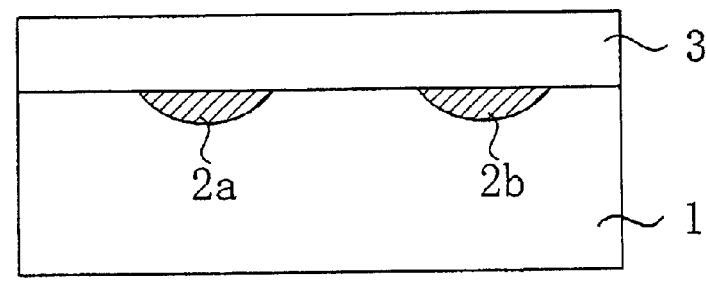
Figure 13C:
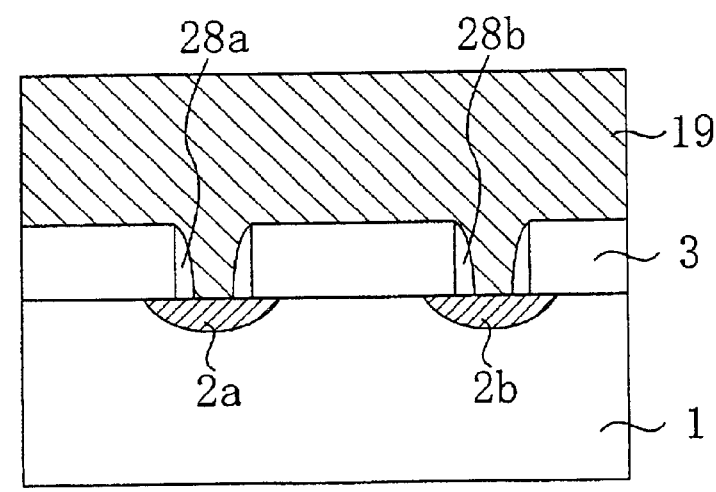
Figure 14A:
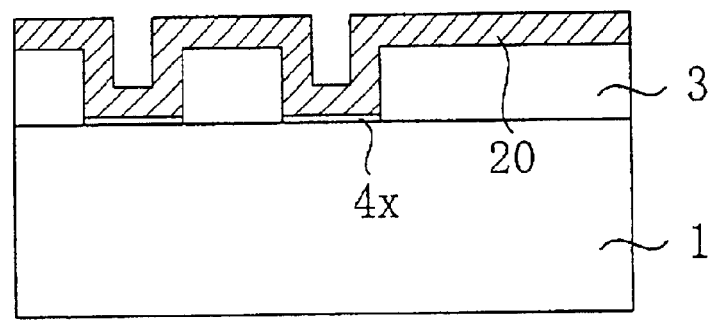
FIGS. 14(a) through 14(c) are sectional views for showing procedures up to formation of a first polysilicon film in the manufacture of the semiconductor storage device of Embodiment 2.
Figure 14B:
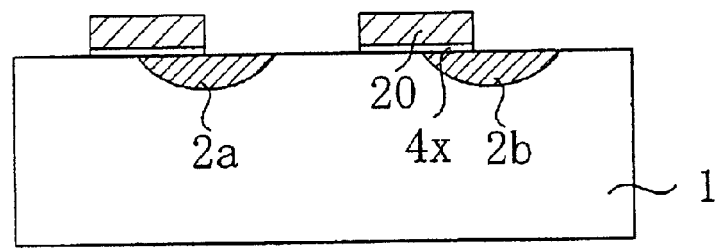
Figure 14C:
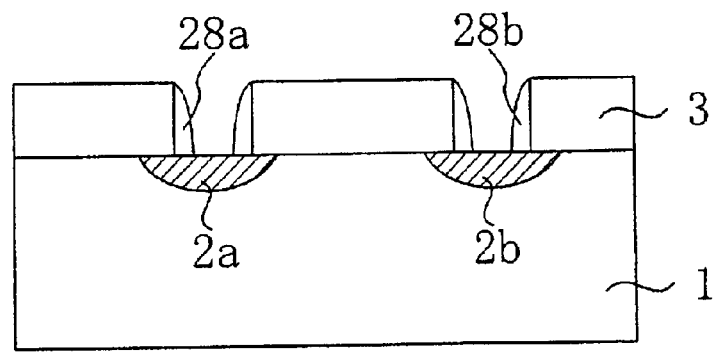
Figure 15A:
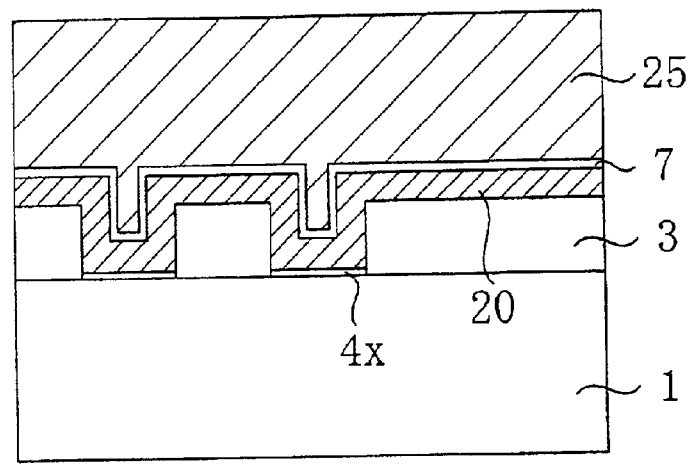
FIGS. 15(a) through 15(c) are sectional views for showing procedures up to densifying of a second silicon oxide film in the manufacture of the semiconductor storage device of Embodiment 2.
Figure 15B:
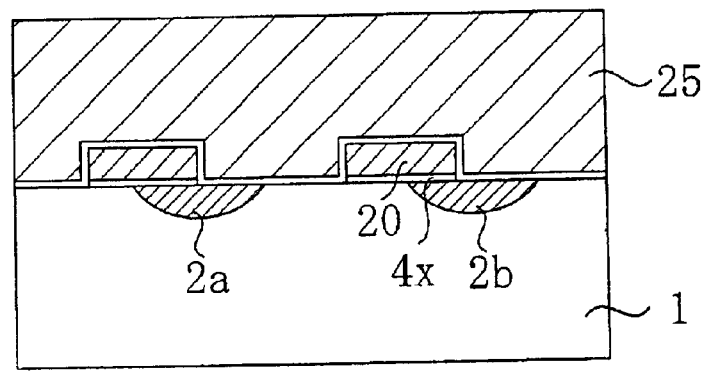
Figure 15C:
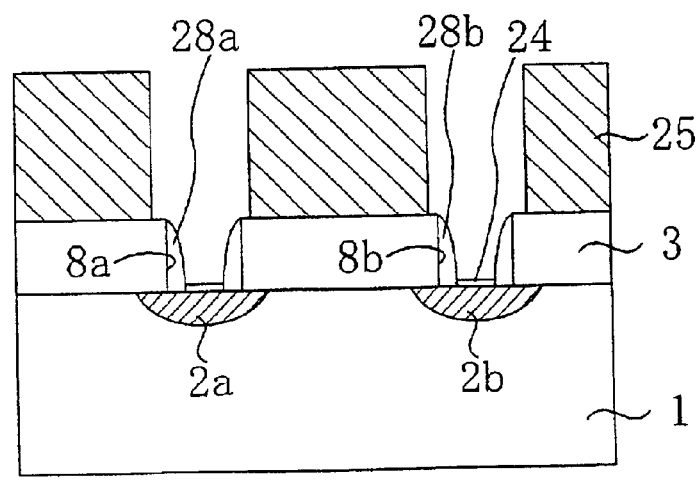
Figure 16A:
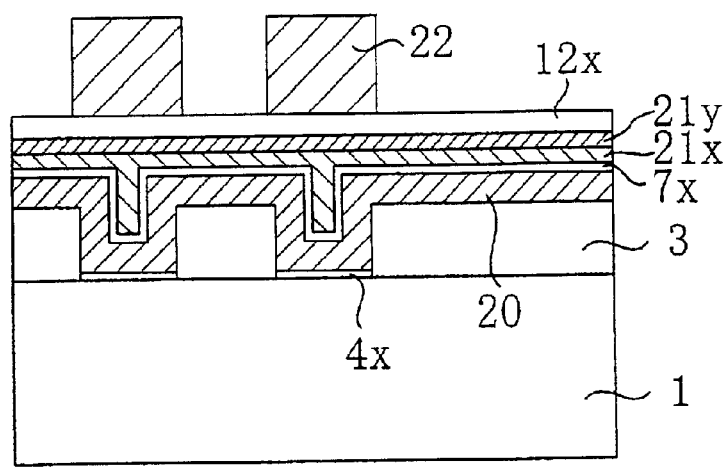
FIGS. 16(a) through 16(c) are sectional views for showing procedures up to formation of a photoresist mask for forming a control gate electrode in the manufacture of the semiconductor storage device of Embodiment 2.
Figure 16B:
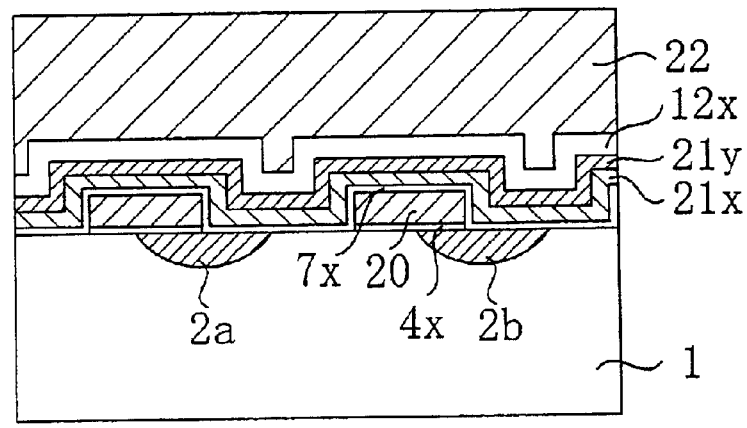
Figure 16C:
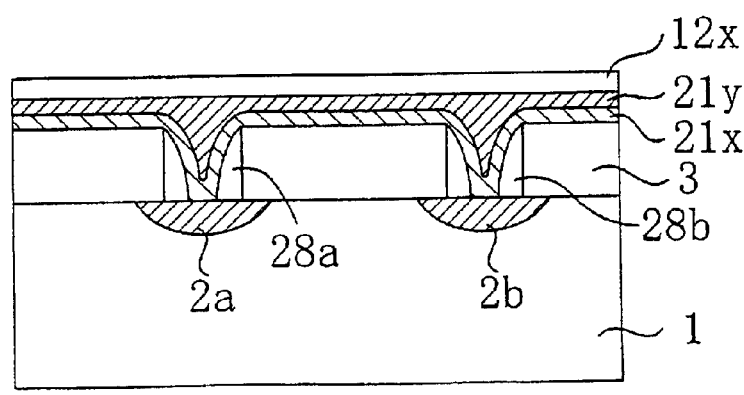
Figure 17A:
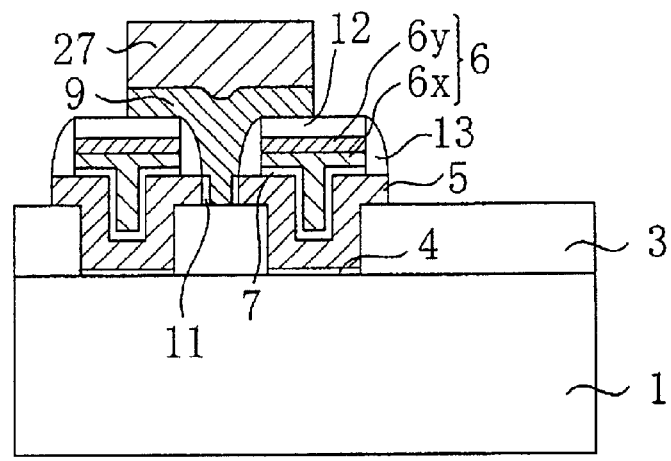
FIGS. 17(a) through 17(c) are sectional views for showing procedures up to formation of an erase gate electrode in the manufacture of the semiconductor storage device of Embodiment 2.
Figure 17B:
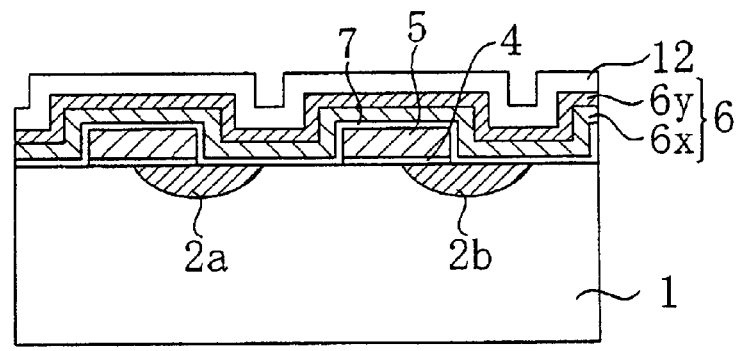
Figure 17C:
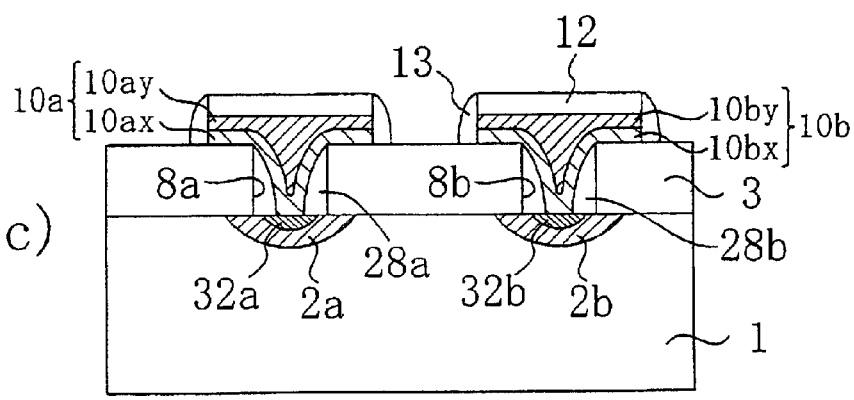
Figure 18A:
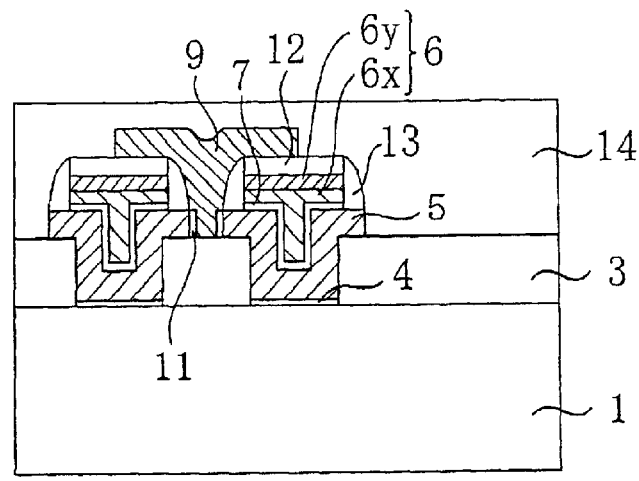
FIGS. 18(a) through 18(c) are sectional views for showing procedures up to formation of an interlayer insulating film and an interconnect layer in the manufacture of the semiconductor storage device of Embodiment 2.
Figure 18B:
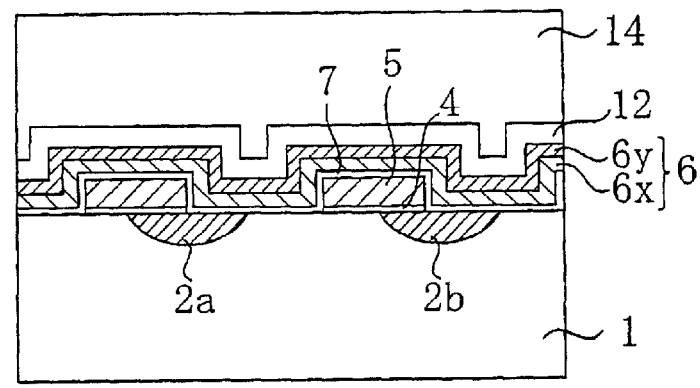
Figure 18C:
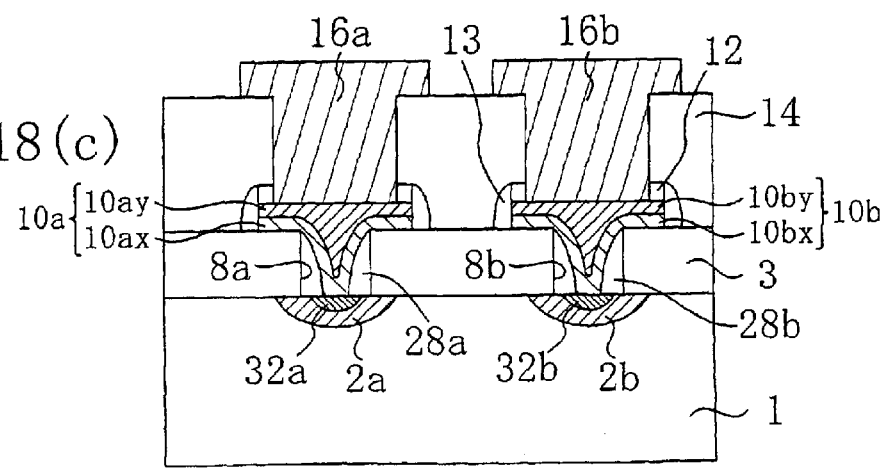
Figure 19:
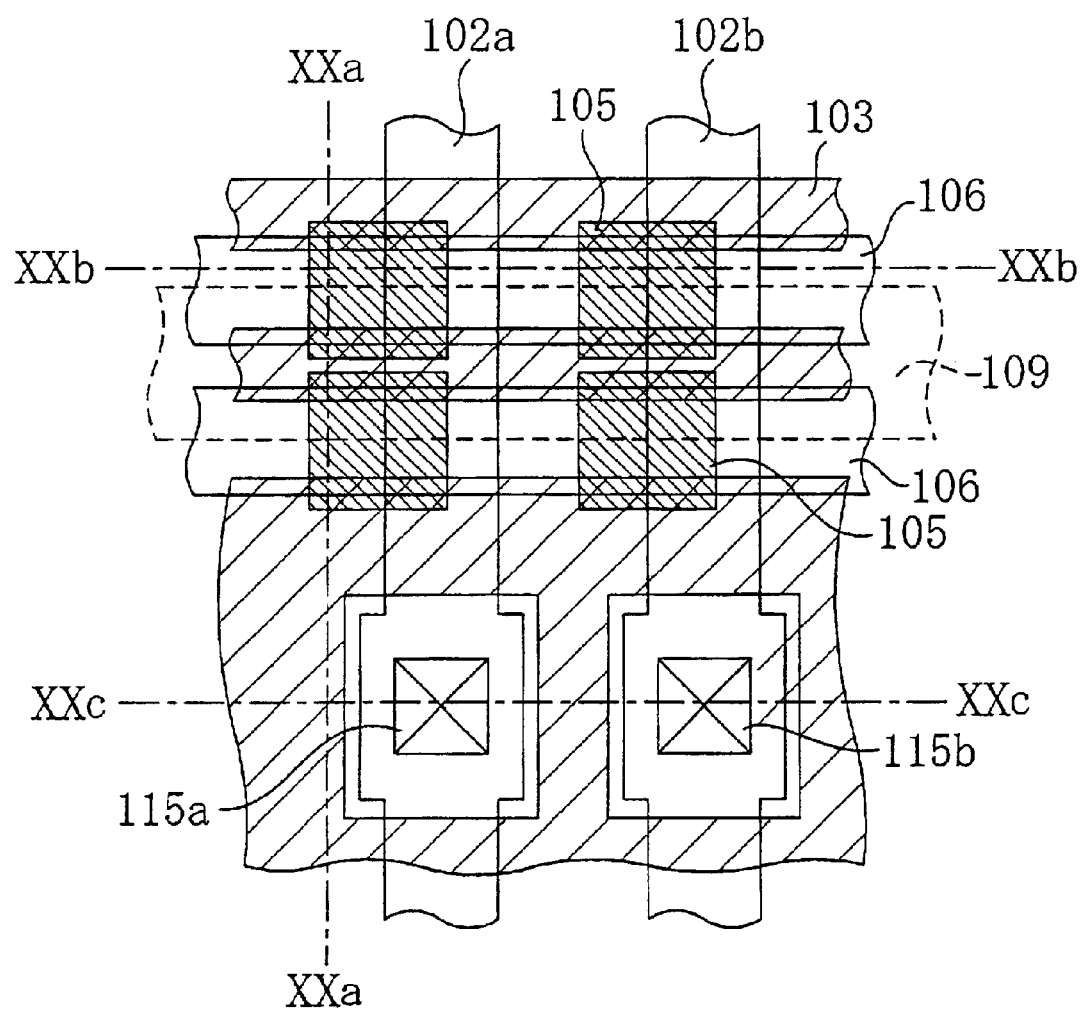
FIG. 19 is a plan view of a conventional floating gate semiconductor storage device.

Next, in procedures shown in FIGS. 12(a) through 12(c), after removing the photoresist mask 17 for forming diffusion layers, the implanted impurity is diffused through a heat treatment conducted, for example, in an atmosphere of nitrogen at approximately 950° C. for approximately 30 minutes. Thus, N-type first and second diffusion layers 2a and 2b with a depth of approximately 0.4 μm are formed.

Furthermore, after removing the protection oxide film 30, a silicon oxide film 18 for isolation with a thickness of approximately 400 nm is deposited on the substrate by known low pressure CVD, and a photoresist mask 23 for forming a lower contact hole is formed on the silicon oxide film 18. Then, portions of the silicon oxide film 18 for isolation positioned below openings of the photoresist mask 23 are removed by known anisotropic dry etching, thereby forming lower contact holes 8a and 8b. At this point, the lower contact holes 8a and 8b have a lateral dimension of approximately 300 nm.

Next, in procedures shown in FIGS. 13(*a*) through 13(*c*), after removing the photoresist mask 23, a silicon oxide film with a thickness of approximately 100 nm is deposited on the substrate and is subjected to anisotropic etching, thereby forming insulator sidewalls 28a and 28b on the side faces of the lower contact holes 8a and 8b. At this point, the silicon oxide film is over-etched by a thickness of approximately 20 nm. Thus, the lateral dimension on the bottom of the lower contact holes 8a and 8b is reduced by approximately 160 nm.

Subsequently, a photoresist mask 19 for forming an isolation is formed on the substrate, and portions of the silicon oxide film 18 for isolation positioned below openings of the photoresist mask 19 are removed by known anisotropic dry etching, thereby forming an isolation insulating film 3. The isolation insulating film 3 and the lower contact holes 8a and 8b can be simultaneously formed. However, they are preferably separately formed because the photoresist mask 23 for forming a lower contact hole is a pattern having independent openings but the photoresist mask 19 for forming an isolation is a line and space pattern.

Then, in procedures shown in FIGS. 14(*a*) through 14(*c*), the photoresist mask 19 for forming an isolation is removed. Subsequently, a portion on the surface of the Si substrate 1 surrounded with the isolation insulating film 3 is oxidized by known thermal oxidation, thereby forming a first silicon oxide film 4x with a thickness of 30 nm. Furthermore, a first polysilicon film 20 with a thickness of approximately 300 nm is deposited on the first silicon oxide film 4x by known low pressure CVD. Then, the first polysilicon film 20 and the first silicon oxide film 4x are partially removed by a known photoetching technique.

Next, in procedures shown in FIGS. 15(*a*) through 15(*c*), a second silicon oxide film 7x with a thickness of approximately 15 nm is deposited on the substrate by known low pressure CVD, and the second silicon oxide film 7x is densified by conducting a heat treatment at 900° C. At this point, a parasitic silicon oxide film 24 is formed also on the bottoms of the lower contact holes 8a and 8b. Therefore, a photoresist mask 25 for removing the parasitic silicon oxide film 24 is formed.

Then, in procedures shown in FIGS. 16(*a*) through 16(*c*), the parasitic silicon oxide film 24 is removed by known wet etching, for example, by using a hydrofluoric acid aqueous solution, and the photoresist mask 25 for removing the parasitic silicon oxide film is then removed. Subsequently, a non-doped lower second polysilicon film 21x with a thickness of approximately 150 nm, an upper second polysilicon film 21y with a thickness of approximately 150 nm doped with an N-type impurity in a concentration of approximately $1 \times 10^{20}/cm^3$ by, for example, impurity doping conducted during CVD, and a third silicon oxide film 12x with a thickness of approximately 300 nm are successively formed on the substrate by known low pressure CVD. Then, a photoresist mask 22 for forming a control gate electrode is formed by a known photolithography technique. The lower second polysilicon film 21x is deposited in a polysilicon state by growing at a comparatively high temperature, so that the doped impurity can be included in the upper second polysilicon film 21y alone in a comparatively high concentration while preventing the impurity from diffusing into the lower second polysilicon film 21x through a heat treatment subsequently conducted.

Next, in procedures shown in FIGS. 17(*a*) through 17(*c*), etching is conducted by using the photoresist mask 22, thereby patterning the third silicon oxide film 12x into a gate upper insulating film 12. After removing the photoresist mask 22 for forming a control gate electrode, etching is conducted by using the gate upper insulating film 12 as a mask, thereby patterning the lower and upper second polysilicon films 21x and 21y and 122 the second silicon oxide film 7x into a control gate electrode 6 including a lower gate 6x and an upper gate 6y, first and second contact members 10a and 10b filled in the first and second lower contact holes 8a and 8b, and a capacitor dielectric film 7. At this point, a lateral dimension from the bottom of the first or second lower contact hole 8a or 8b to the upper end of the first or second contact member 10a or 10b is approximately 800 nm, and a lateral dimension of the upper end of the first and second contact members 10a and 10b is approximately 0.5 μm.

Subsequently, a silicon oxide film with a thickness of approximately 200 nm is deposited on the substrate by known low pressure CVD, and the silicon oxide film is subjected to known anisotropic dry etching, thereby forming insulator sidewalls 13 on the side faces of the control gate electrode 6, the capacitor dielectric film 7 and the gate upper insulating film 12 and the side faces of the first and second contact members 10a and 10b. Next, known anisotropic dry etching is conducted by using the gate upper insulating film 12 and the insulator sidewalls 13 as masks, the first polysilicon film 20 is patterned into a floating gate electrode 5. Then, the exposed side face of the floating gate electrode 5 is oxidized by known thermal oxidation, for example, conducted in an atmosphere of vapor at approximately 900° C. for 20 minutes. Thus, a tunneling insulating film 11 of a silicon oxide film with a thickness of approximately 30 nm is formed. Thereafter, a third polysilicon film (not shown) with a thickness of approximately 400 nm is deposited on the substrate by known low pressure CVD. Then, a photoresist mask 27 for patterning the third polysilicon film is formed on the substrate, and the third polysilicon film is patterned by known anisotropic dry etching into an erase gate electrode 9.

Next, in procedures shown in FIGS. 18(*a*) through 18(*c*), an interlayer insulating film 14 of a BPSG film with a thickness of approximately 1.6 μm is deposited by known low pressure CVD and is flattened by reflow. After the reflow, the interlayer insulating film 14 has a thickness of 200 through 300 nm in a thinnest portion and of approximately 2 μm in a thickest portion. Furthermore, the interlayer insulating film 14 has a thickness of approximately 1.6 μm in a portion on the isolation insulating film 3 and has a thickness of approximately 1.2 μm in portions above the first and second contact members 10a and 10b.

Thereafter, first and second upper contact holes 15a and 15b are formed in the interlayer insulating film 14 so as to respectively reach the first and second contact members 10a and 10b. Since the interlayer insulating film 14 has a thickness of approximately 1.2 μm in the portions above the first and second contact members 10a and 10b, the depth of the first and second upper contact holes 15a and 15b is also approximately 1.2 μm. Furthermore, the first and second upper contact holes 15a and 15b have a diameter of approximately 0.3 μm. Then, a metal interconnect layer 16 is formed so as to fill the first and second upper contact holes 15a and 15b and partially cover the interlayer insulating film 14.

Procedures subsequently conducted for forming a protection film and a bonding pad are herein omitted in the description and the drawings.

Also by the method of manufacturing a semiconductor storage device of this embodiment, similarly to Embodiment 1, the increase of the aspect ratio of the first and second upper contact holes 15a and 15b can be effectively suppressed with keeping the same lateral dimension thereof as in the conventional semiconductor storage device.

Differently from the method of Embodiment 1, the control gate electrode 6 and the first and second contact members 10a and 10b are simultaneously formed by patterning the same second polysilicon films 21x and 21y in the manufacturing method of this embodiment. Accordingly, without increasing the number of procedures as compared with that in the conventional method, not only the same effect as attained by Embodiment 1 can be exhibited but also increase of leakage between the source/drain regions can be definitely suppressed by preventing diffusion of the impurity from the first and second contact members 10a and 10b to regions over the first and second diffusion layers 2a and 2b as described above.

As a result, an overlap margin in photolithography between the photoresist mask 23 for forming the lower contact holes 8a and 8b and the photoresist mask 17 for forming the first and second diffusion layers 2a and 2b can be set large.

Furthermore, the lower contact holes 8a and 8b are formed before forming the isolation insulating film 3 from the silicon oxide film 18 for isolation in this embodiment. Therefore, the lower contact holes 8a and 8b can be formed when there is no level difference in the silicon oxide film 18 for isolation, and hence, the lateral dimension of the lower contact holes 8a and 8b can be minimized to a resolution limit of the photolithography. In addition, this can ease the formation of the insulator sidewalls 28a and 28b.

The first and second contact members 10a and 10b are not always required to partially cover the isolation insulating film 3 and can be formed so as to merely fill the first and second lower contact holes 8a and 8b. Also in this case, the effect to suppress the increase of the aspect ratio derived from the reduced depth of the first and second upper contact holes 15a and 15b can be exhibited.

However, when the first and second contact members 10a and 10b partially cover the isolation insulating film 3 so as to work as the extension electrodes, the diameter of the first and second upper contact holes 15a and 15b can be increased, resulting in more remarkably exhibiting the effect to suppress the increase of the aspect ratio.

Moreover, the first and second contact members 10a and 10b can be formed from conductive films, such as polysilicon films, different from films used for forming the floating gate electrode 5, the control gate electrode 6 and the erase gate electrode 9. In this case, the first and second contact members 10a and 10b can be formed at any timing as far as it is after forming the lower contact holes 8a and 8b, or after forming the insulator sidewalls 28a and 28b when the insulator sidewalls 28a and 28b are provided, and before forming the interlayer insulating film 14. However, in order to prevent the diffusion of the impurity as far as possible, the first and second contact members 10a and 10b are preferably formed at a timing as late as possible.

What is claimed is:

1. A method of manufacturing a semiconductor storage device comprising the steps of:
    (a) forming first and second diffusion layers working as source/drain regions in a semiconductor substrate;
    (b) forming an insulating film for isolation on an area including a part of said first diffusion layer and a part of said second diffusion layer after the step (a);
    (c) forming an isolation insulating film by patterning said insulating film for isolation;
    (d) forming first and second lower contact holes respectively reaching said first and second diffusion layers by patterning said insulating film for isolation after, before or simultaneously with the step (c);
    (e) forming a first insulating film on said semiconductor substrate in an area surrounded with said isolation insulating film after the step (c);
    (f) forming a first conductive film, a second insulating film, a second conductive film and a third insulating film successively on said first insulating film after the step (e);
    (g) forming a gate upper insulating film, a control gate electrode and a capacitor dielectric film by patterning said third insulating film, said second conductive film and said second insulating film after the step (f);
    (h) forming an insulator sidewall on side faces of said capacitor dielectric film, said control gate electrode and said gate upper insulating film after the step (g);
    (i) forming a floating gate electrode by removing said first conductive film through etching by using said insulator sidewall as a mask after the step (h);
    (j) forming a tunneling insulating film on a side face of said floating gate electrode after the step (i);
    (k) forming an erase gate electrode opposing said floating gate electrode with said tunneling insulating film sandwiched therebetween after the step (j); and
    (l) forming first and second contact members filled in said first and second lower contact holes;
    (m) forming an interlayer insulating film on said semiconductor substrate after the steps (d) and (l);
    (n) forming first and second upper contact holes in said interlayer insulating film respectively reaching said first and second lower contact holes; and
    (o) forming a metal interconnect layer filled in said first and second upper contact holes.

2. The method of manufacturing a semiconductor storage device of claim 1, wherein said insulating film for isolation is formed by CVD in the step (b).

3. The method of manufacturing a semiconductor storage device of claim 1, wherein the step (l) and the step (k) are simultaneously carried out, and said contact members and said erase gate electrode are simultaneously farmed by forming and patterning a third conductive film in the step (l).

4. The method of manufacturing a semiconductor storage device of claim 1, wherein said contact members are made from a stacked film including a refractory metal film and a semiconductor film in the step (l).

5. The method of manufacturing a semiconductor storage device of claim 1, wherein said contact members are made from a stacked film including two or more semiconductor films having different impurity concentrations.

6. The method of manufacturing a semiconductor storage device of claim 1, wherein upper ends of said first and second contact members are respectively sited under the upper end of said interlayer insulating film.

7. The method of manufacturing a semiconductor storage device of claim 1, wherein upper ends of said first and second contact members are respectively sited above the upper end of said insulating film.

8. The method of manufacturing a semiconductor storage device of claim 1, wherein the diameter of said first and second upper contact members is larger than that of said first and second lower contact holes.

9. A method of manufacturing a semiconductor storage device comprising the steps of:
   (a) forming first and second diffusion layers working as source/drain regions in a semiconductor substrate;
   (b) forming an insulating film for isolation on an area including a part of said first diffusion layer and a part of said second diffusion layer after the step (a);
   (c) forming an isolation insulation film by patterning said insulating film for isolation;
   (d) forming first and second lower contact holes respectively reaching said first and second diffusion layers by patterning said insulating film for isolation after, before or simultaneously with the step (c);
   (e) forming a first insulating film on said semiconductor substrate in an area surrounded with said isolation insulating film after the step (c);
   (f) forming a first conductive film, a second insulating film, a second conductive film and a third insulating film successively on said first insulating film after the step (e);
   (g) forming a gate upper insulating film, a control gate electrode and a capacitor dielectric film by patterning said third insulating film, said second conductive film and said second insulating film after the step (f);
   (h) forming an insulator sidewall on sidewall on side faces of said capacitor dielectric film, said control gate electrode and said gate upper insulating film after the step (g);
   (i) forming a floating gate electrode by removing said first conductive film through etching by using said insulator sidewall as a mask after the step (h);
   (j) forming a tunneling insulating film on a side face of said floating gate electrode after the step (i);
   (k) forming an erase gate electrode opposing said floating gate electrode with said tunneling insulating film sandwiched therebetween after the step (j); and
   (l) forming contact members filled in said lower contact holes, wherein the step (d) is carried out before the step (e),
   said second conductive film and said third insulating film are formed on said lower contact holes in the step (f), and the step (l) and the step (g) are simultaneously carried out.

10. A method of manufacturing a semiconductor storage device comprising the steps of:
   (a) forming first and second diffusion layers working as source/drain regions in a semiconductor substrate;
   (b) forming an insulating film for isolation on an area including a part of said first diffusion layer and a part of said second diffusion layer after the step (a);
   (c) forming an isolation insulating film by patterning said insulating film for isolation;
   (d) forming first and second lower contact holes respectively reaching said first and second diffusion layers by patterning said insulating film for isolation after, before or simultaneously with the step (c);
   (e) forming a first insulating film on said semiconductor substrate in an area surrounded with said isolation insulating film after the step (c);
   (f) forming a first conductive film, a second insulating film, a second conductive film and a third insulating film successively on said first insulating film after the step (e);
   (g) forming a gate upper insulating film, a control gate electrode and a capacitor dielectric film by patterning said third insulating film, said second conductive film and said second insulating film after the step (f);
   (h) forming an insulator sidewall on side faces of said capacitor dielectric film, said control gate electrode and said gate upper insulating film after the step (g);
   (i) forming a floating gate electrode by removing said first conductive film through etching by using said insulator sidewall as a mask after the step (h);
   (j) forming a tunneling insulating film on a side face of said floating gate electrode after the step (i);
   (k) forming an erase gate electrode opposing said floating gate electrode with said tunneling insulating film sandwiched therebetween after the step (j); and
   (l) forming contact members filled in said lower contact holes,
   further comprising, before the step (f), a step of forming an insulator sidewall on side faces of said first and second lower contact holes.

11. A method of manufacturing a semiconductor storage device comprising the step of;
   (a) forming first and second diffusion layers working as source/drain regions in a semiconductor substrate;
   (b) forming an insulating film for isolation on an area including a part of said first diffusion layer and a part of said second diffusion layer after the step (a);
   (c) forming an isolation insulating film by patterning said insulating film for isolation;
   (d) forming first and second lower contact holes respectively reaching said first and second diffusion layers by patterning said insulating film for isolation after, before or simultaneously with the step (c);
   (e) forming a first insulating film on said semiconductor substrate in an area surrounded with said isolation film after the step (c);
   (f) forming a first conductive film, a second insulating film, a second conductive film and a third insulating film successively on said first insulating film after the step (e);
   (g) forming a gate upper insulating film, a control gate electrode and a capacitor dielectric film by patterning said third insulating film, said second conductive film and said second insulating film after the step (f);
   (h) forming an insulator sidewall on side faces of said capacitor dielectric film, said control gate electrode and said gate upper insulating film after the step (g);
   (i) forming a floating gate electrode by removing said first conductive film through etching by using said insulator sidewall as a mask after the step (h);
   (j) forming a tunneling insulating film on a side face of said floating gate electrode after the step (i);
   (k) forming an erase gate electrode opposing said floating gate electrode with said tunneling insulating film sandwiched therebetween after the step (j); and
   (l) forming contact members filled in said lower contact holes, wherein the step (d) is carried out before the step (e).

12. A method of manufacturing a semiconductor storage device comprising the steps of:

(a) forming first and second diffusion layers working as source/drain regions in a semiconductor substrate;

(b) forming an insulating film for isolation on an area including a part of said first diffusion layer and a part of said second diffusion layer after the step (a);

(c) forming an isolation insulating film by patterning said insulating film for isolation;

(d) forming first and second lower contact holes respectively teaching said first and second diffusion layers by patterning said insulating film for isolation after, before or simultaneously with the step (c);

(e) forming a first insulating film on said semiconductor substrate in an area surrounded with said isolation insulating film after the step (c);

(f) forming a first conductive film, a second insulating film, a second conductive film and a third insulating film successively on said first insulating film after the step (e);

(g) forming a gate upper insulating film, a control gate electrode and a capacitor dielectric film by patterning said third insulating film, said second conductive film and said second insulating film after the step (f);

(h) forming an insulating sidewall on side faces of said capacitor dielectric film, said control gate electrode and said gate upper insulating film after the step (g);

(i) forming a floating gate electrode by removing said first conductive film through etching by using said insulator sidewall as a mask after the step (h);

(j) forming a tunneling insulating film on a side face of said floating gate electrode after the step (i);

(k) forming an erase gate electrode opposing said floating gate electrode with said tunneling insulating film sandwiched therebetween after the step (j); and (l) forming contact members filled in said lower contact holes, wherein said contact members are made from a stacked film including two or more semiconductor films having different impurity concentrations, and said contact members are formed in the step (l) by successively depositing a non-doped polysilicon film and an amorphous silicon film on said semiconductor substrate, implanting impurity ions into said amorphous silicon film, and patterning said polysilicon film and said amorphous silicon film.

13. A method of manufacturing a semiconductor storage device comprising the steps of:

(a) forming first and second diffusion layers working as source/drain regions in a semiconductor substrate;

(b) forming an insulating film for isolation on an area including a part of said first diffusion layer and a part of said second diffusion layer after the step (a);

(c) forming an isolation insulating film by patterning said insulating film for isolation;

(d) forming first and second lower contact holes respectively reaching said first and second diffusion layers by patterning said insulating film for isolation after, before or simultaneously with the step (c);

(e) forming a first insulating film on said semiconductor substrate in an area surrounded with said isolation insulating film after the step (c);

(f) forming a first conductive film, a second insulating film, a second conductive film and a third insulating film successively on said first insulating film after the step (e);

(g) forming a gate upper insulating film, a control gate electrode and a capacitor dielectric film by patterning said third insulating film, said second conductive film and said second insulating film after the step (f);

(h) forming an insulator sidewall on side faces of said capacitor dielectric film, said control gate electrode and said gate upper insulating film after the step (g);

(i) forming a floating gate electrode by removing said first conductive film through etching by using said insulator sidewall as a mask after the step (h);

(j) forming a tunneling insulating film on a side face of said floating gate electrode after the step (i);

(k) forming first and second contact members filled in said first and second lower contact holes;

(l) forming an interlayer insulating film on said semiconductor substrate after the steps (d) and (k);

(m) forming first and second upper contact holes in said interlayer insulating film respectively reaching said first and second lower contact holes; and (n) forming a metal interconnect layer filled in said first and second upper contact holes.

* * * * *

UNITED STATES PATENT AND TRADEMARK OFFICE
CERTIFICATE OF CORRECTION

PATENT NO. : 6,734,067 B2
DATED : May 11, 2004
INVENTOR(S) : Fumihiko Noro

It is certified that error appears in the above-identified patent and that said Letters Patent is hereby corrected as shown below:

Title page,
Item [56], References Cited, U.S. PATENT DOCUMENTS, please add the following:
-- US-6,214,669 B1    April 10, 2001   Hisamune --
FOREIGN PATENT DOCUMENTS, please add the following:
-- JP 06-045329    February 18, 1994    Shin et al.
   JP 06-151433    May 31, 1994         Kobayashi
   JP 08-139193    May 31, 1996         Miyashita
   JP 09-036257    February 7, 1997     Sato et al.
   JP 10-098170    April 14, 1998       Hisamune
   JP 10-098166    April 14, 1998       Iwasa
   JP 10-154800    June 9, 1998         Kuroda --

Column 16,
Line 54, delete "farmed" and add -- formed --

Column 18,
Line 30, delete "of;" and add -- of: --

Signed and Sealed this

Twenty-third Day of November, 2004

JON W. DUDAS
*Director of the United States Patent and Trademark Office*